(12) United States Patent
Tomita

(10) Patent No.: US 6,252,804 B1
(45) Date of Patent: Jun. 26, 2001

(54) SEMICONDUCTOR INTEGRATED CIRCUIT, AND METHOD OF CONTROLLING SAME

(75) Inventor: Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/629,619

(22) Filed: Jul. 31, 2000

(30) Foreign Application Priority Data

Nov. 9, 1999  (JP) ................................... 11-318394

(51) Int. Cl.$^7$ ................................................ G11C 11/40
(52) U.S. Cl. ........................ 365/189.05; 365/230.08; 365/185.12
(58) Field of Search ................... 365/49, 189.05, 365/230.8, 185.12, 185.13

(56) References Cited

U.S. PATENT DOCUMENTS 6,188,639 * 2/2001 Sakakibara ................. 365/230.08

* cited by examiner

*Primary Examiner*—Terrell W. Fears
(74) *Attorney, Agent, or Firm*—Arent Fox Kintner Plotkin & Kahn, PLLC

(57) ABSTRACT

A semiconductor integrated circuit comprising memory cells and a holding unit. The holding unit holds write data to the memory cell and mask information for masking a predetermined bit or bits of the write data, both supplied corresponding to a write command, as held write data and held mask information. On receiving a next write command, the semiconductor integrated circuit masks held write data in accordance with held mask information and writes the resultant to the memory cell. The holding unit holds next write data and next mask information supplied corresponding to this write command as held write data and held mask information. That is, the held write data and the held mask information are rewritten. Thereby, the semiconductor integrated circuit which writes write data previously accepted upon the reception of a next write command can mask the write data.

9 Claims, 27 Drawing Sheets

SEMICONDUCTOR INTEGRATED CIRCUIT, AND METHOD OF CONTROLLING SAME

BACKGROUND OF THE INVENTION

1. Field of the Invention

The present invention relates to a semiconductor integrated circuit comprising a memory cell and a method of controlling the same. In particular, the present invention relates to a semiconductor integrated circuit having a data masking function.

2. Description of the Related Art

With the development of semiconductor manufacturing technologies, semiconductor integrated circuits have been increasing its operating speed. In particular, the operating frequencies of microcomputers and the like have been improving year after year, further increasing the difference with the operating frequencies of semiconductor memories such as a DRAM.

To reduce this difference, high-speed memories including SDRAMs (Synchronous DRAMs), DDR SDRAMS (Double Data Rate Synchronous DRAMs), and FCRAMs (Fast cycle RAMs) have been developed.

FIG. 1 shows an example of a DDR SDRAM (hereinafter, also simply referred to as SDRAM) in which data are input/output in synchronization with rising edges and falling edges of a clock signal. Parenthetically, in the drawings, those signal lines shown by thick lines each comprise a plurality of lines. Some of the circuits connected with the thick lines consist of a plurality of components.

The SDRAM comprises an input/output control unit 1, a chip control unit 2, and a plurality of memory core units 3. If the SDRAM consists of a plurality of banks, a group of the chip control unit 2 and the memory core units 3 are provided for each of the banks.

The input/output control unit 1 comprises a clock buffer 4, a command decoder 5, an address buffer 6, a DQS butter 7, a mask buffer/latch 8, an input/output buffer/register 9, serial-parallel converters 10 and 11, and a parallel-serial converter 12.

The clock buffer receives a clock signal CLK from the exterior and outputs the received signal to a predetermined circuit as an internal clock signal ICLK. The command decoder 5 receives a command signal CMD, analyzes the received command and outputs the resultant as an internal command signal ICMD. The address buffer 6 receives an address signal AD, and outputs the received signal as an internal address signal IAD. The SDRAM does not adapt an address multiplex type; therefore, the address signal A/D is supplied once in every read operation and in every write operation.

The DQS buffer 7 receives a data strobe signal DQS, and outputs the received signal as an internal data strobe signal IDQS. The mask buffer/latch 8, when an enable signal ENA is activated, accepts a data mask signal DM in synchronization with the internal data strobe signal IDQS. The mask buffer/latch 8 then outputs the accepted signal to the serial-parallel converter 10. The input/output buffer/register 9 receives an output data signal DOUT in a read operation. When the enable signal ENA is activated, the received signal is output as a data signal DQ in synchronization with the internal data strobe signal IDQS. Moreover, the input/output buffer/register 9, when the enable signal ENA is activated in a write operation, accepts a data signal DQ in synchronization with the internal data strobe signal IDQS. The accepted data is output as an input data signal DIN.

The serial-parallel converter 10 converts mask signals sequentially supplied from the mask buffer/latch 8 into a parallel form and outputs the resultant as an internal mask signal IDM. The serial-parallel converter 11 sequentially receives input data signals DN of serial form supplied from the input/output buffer/register 9. The serial-parallel converter 11 converts the received signals into a parallel form, and outputs the resultant as a write data signal WDB. The parallel-serial converter 12 converts a read data signal RDB of parallel form, supplied from a sense buffer 16 into serial forms. The parallel-serial converter 12 sequentially outputs the resultants as output data signals DOUT.

The chip control unit 2 comprises a command latch 13, a control circuit 14, a data masking circuit 15, the sense buffer 16, and a write amplifier 17.

The command latch 13 receives the internal command signal ICMD, and outputs a read control signal RD, a write control signal WR, and the like, in accordance with the received signal. The control circuit 14 receives the read control signal RD and the write control signal WR, and outputs the enable signal ENA and a plurality of timing signals. The timing signals are supplied to the sense buffer 16 and the write amplifier 17, along with row decoders 19, sense amplifiers 20, and column decoders 21 in the memory core units 3.

The data masking circuit 15 masks a predetermined bit or bits of the write data signal WDB in accordance with the internal mask signal IDM. The masked signal is output as a write data signal WDBM.

The sense buffer 16 receives a data signal DB from the memory core units 3, and outputs the received signal as the read data signal RDB in synchronization with the timing signal. The write amplifier 17 receives the write data signal WDBM, and outputs the received signal as a data signal DB in synchronization with the timing signal.

The memory core units 3 each comprise a memory cell unit 18, the row decoder 19, the sense amplifier 20, and the column decoder 21. The memory cell unit 18 includes a plurality of memory cells MC.

The row decoder 19 receives the timing signal and a predecoding signal generated from the internal address signal IAD and activates word lines WL connected with the memory cells MC. The column decoder 21 receives the timing signal and the predecoding signal generated from the internal address signal IAD and activates column switches (not shown) connected with bit lines BL. The sense amplifier 2 amplifies data transmitted from the memory cells MC through the bit lines BL in a read operation and amplifies the data signal DB supplied in a write operation.

FIG. 2 shows an example where the SDRAM described above executes a write operation between read operations. In this example, the read latency, which is a number of clocks from the reception of a read command to the output of read data, is "2". The write latency, which is a number of clocks from the reception of a write command to the reception of write data, is "0".

In the following descriptions, some abbreviations may be used such as "CLK signal" for the "clock signal CLK".

For a start, read commands RD0 and RD1 are sequentially supplied in synchronization with the CLK signal to operate the memory core units 3 (FIG. 2(*a*)). Read addresses not shown are supplied along with the read commands. The memory core units 3 output read data approximately one clock after the reception of the respective read commands. Subsequently, input/output circuit is operated (FIG. 2(*b*)). Here, the input/output circuit corresponds to the sense buffer 16, the parallel-serial converter 12, and the input/output buffer/register 9 shown in FIG. 1.

Then, read data Q00, Q01, Q10, and Q11 are sequentially output as the data signals DQ, two clocks after the reception of the respective read commands RD0 and RD1. The read data Q00 and Q01, as well as Q10 and Q11, are generated by the parallel-serial converter 12 converting the read data RDB of parallel form.

Subsequently is supplied a write command. Since the terminals to transmit those DQ signals are input/output terminals, write data DA0 and DA1 cannot be supplied until after the output of the read data Q11 for the sake of avoiding a signal conflict. Besides, with the write latency at "0", the write command WRA is supplied in synchronization with the same CLK signal as the write data DA0 (FIG. 2(c)). Though omitted of specific illustration, a write address is supplied along with the write data.

After the reception of the write command WRA, input/output circuit is operated to convert the write data DA0 and DA1 into a parallel form. The converted write data WDB are masked for a predetermined bit or bits by the data masking circuit 15, and transmitted to the memory core units 3 as write data WDBM (FIG. 2(d)). The input/output circuit here corresponds to the input/output buffer/register 9, the serial-parallel converter 11, the data masking circuit 15, and the write amplifier 17 shown in FIG. 1. The memory core units 3 operate approximately one clock after the reception of the write command WRA, writing the data to the memory cells MC (FIG. 2(e)).

Next, a read command is supplied. Here, in order to prevent the operational overlaps of the memory core units 3, the read command RD2 needs to be supplied in synchronization with the CLK signal two clocks after the reception of the write command WRA. Subsequently, the memory core units 3 and the input/output circuit make the same operation as the read operations described above (FIG. 2(f)). Then, the first read data Q20 is output after two clocks corresponding to the read latency.

As described above, the SDRAM shown in FIG. 1 transmits no data signal DQ over a period of three clocks or more when performing a read operation after a write operation. This consequently lowers the usage efficiency of the data bus for transmitting data signals DQ.

FIG. 3 shows another example of a DDR SDRAM.

This SDRAM differs from that of FIG. 1 in the circuit configuration of the chip control unit 2. That is, the SDRAM has a shift register 22 between the command latch 13 and the control circuit 14. The shift register 22 accepts the WR signal output from the command latch 13, delays the accepted signal by a predetermined number of clocks, and outputs the delayed signal to the control circuit 14 as a delayed write control signal WRD. On this account, the control circuit 14 starts operating the predetermined number of clocks after the write command is supplied. The other circuit configuration is the same as that of FIG. 1.

FIG. 4 shows an example where the SDRAM described above executes a write operation between read operations. In this example, both the read latency and the write latency are "2".

The operations corresponding to the initially-supplied read commands RD0 and RD1 are identical to as those of FIG. 2, and therefore description thereof will be omitted.

In this SDRAM, the write command WRA is supplied two clocks after the reception of the read command RD1. Since the write latency in this example is "2", the write data DA0 and DA1 are supplied two clocks after the write command WRA. That is, the write data DA0 and DA1 are supplied in synchronization with the CLK signal that comes after the output of the read data Q11 (FIG. 4(a)).

Subsequently, the write operation and read operations are executed under the same timing as that of FIG. 2.

In the SDRAM shown in FIG. 3, the write command can be supplied at earlier timing, whereas the internal operations are identical to those of FIG. 2. Therefore, as under the timing shown in FIG. 2, no data signal DQ is transmitted over a period of three clocks or more when the read operation is performed after the write operation, thereby lowering the usage efficiency of the data bus.

As seen from above, conventional SDRAMS have had a problem that random accesses including both read and write operations lower the usage efficiencies of their data buses. A drop in the usage efficiency of data bus decreases the amount of data transfer per unit time. Accordingly, it has been difficult to apply high-speed memories such as SDRAMs to graphics memories which perform frequent random accesses such as image processing.

For a further improvement of the usage efficiency of the data bus, there has been recently proposed an SDRAM having a so-called "delayed write" function, in which write data supplied corresponding to a write command is written to memory cells when the next write command is supplied.

FIG. 5 shows an example where an SDRAM having the delayed write function of this type performs write operations in between read operations. In this example, both the read latency and the write latency are "2".

The operations corresponding to the read commands RD0 and RD1 initially supplied are identical to those of FIG. 2, and therefore descriptions thereof will be omitted.

In this SDRAM, a write command WR0 is supplied two clocks after the reception of the read command RD1. Since the read latency in this example is set at "2", write data DA0 and DA1 are supplied two clock after the write command WR0. That is, the write data DA0 and DA1 are supplied in synchronization with the CLK signal that comes after the output of the read data Q11 (FIG. 5(a)).

Here, the write data DA0 and DA1 are not written to the memory cells but are held in a register (FIG. 5(b)).

Subsequently, read commands RD2, RD3, and RD4 are sequentially supplied in synchronization with the CLK signal following the write command WR0, whereby read operations are performed at the same timing as that of FIG. 2 (FIG. 5(c)). The memory core units have not performed a write operation so they can immediately perform the read operations. In the SDRAM with the delayed write function, it is consequently possible to minimize the period of not transmitting the data signal DQ, thereby improving the usage efficiency of data bus.

Moreover, the next write command WR1 is supplied two clocks after the reception of the read command RD4 (FIG. 5(d)). In synchronization with the reception of this write command WR1, the input/output circuit and the memory core units operate so that the previous write data DA0 and DA1 held in the register are written to the memory cells (FIG. 5(e)).

Then, write data DA2 and DA3 are supplied two clocks after the write command WR1. The contents of the register are rewritten to the write data DA2 and DA3 (FIG. 5(f)).

In this way, the SDRAM with the delayed write function can execute write operations on the memory cells independent of the accepting timing of write data. Therefore, it can prevent the overlap of the operations of the memory core units respectively corresponding to a write command and the read command supplied immediately after the write command. This consequently improves the usage efficiency of data bus and enhances the amount of data transfer as compared to the SDRAMs shown in FIGS. 1 and 2.

Now, the SDRAMs with the delayed write function are of recently proposed technology and have matters to be considered before commercialization.

For example, the data masking function to mask a predetermined bit or bits of write data is indispensable for graphics memories, however, it has not been specifically considered in the SDRAMs with the delayed write function. Consequently, the SDRAMs with the conventional delayed write function have not been applicable to graphics memories or the like, which require the data masking function.

SUMMARY OF THE INVENTION

An object of the present invention is to provide a data masking function to a semiconductor memory having a delayed write function.

According to one of the aspects of the semiconductor integrated circuit in the present invention, the semiconductor integrated circuit comprises memory cells and a holding unit.

The holding unit respectively holds write data to the memory cells and mask information used for masking a predetermined bit of the write data, both supplied corresponding to a write command, as held write data and held mask information. On receiving a next write command, the semiconductor integrated circuit masks the held write data in accordance with the held mask information and writes the masked data to the memory cells. The holding unit holds next write data and next mask information supplied corresponding to the write command as the held write data and the held mask information. In other words, the held write data and the held mask information are rewritten.

This makes it possible to mask write data in the semiconductor integrated circuit in which the write data previously accepted is written upon the reception of a next write command.

According to another aspect of the semiconductor integrated circuit in the present invention, the semiconductor integrated circuit comprises a data masking circuit. The data masking circuit receives the held write data and the held mask information output from the holding unit and masks the held write data in accordance with the held mask information.

The data masking circuit masks the held write data itself so that the masking function can be implemented with minimum modifications to the write circuit or the like.

According to another aspect of the semiconductor integrated circuit in the present invention, the semiconductor integrated circuit comprises a bit line connected with the memory cells, a switching circuit, a write circuit, and a data masking circuit.

The switching circuit connected with the bit line transmits the held write data to the bit line. The write circuit supplies the held write data to the switching circuit. The data masking circuit controls the write circuit in accordance with the held mask information and mask a predetermined bit of the held write data.

Thus, the data masking circuit controls not the held write data but the write circuit for masking data.

According to another aspect of the semiconductor integrated circuit in the present invention, the semiconductor integrated circuit comprises a decoder for selecting memory cells to be written the held write data and a data masking circuit.

The data masking circuit controls the decoder in accordance with the held mask information and masks a predetermined bit of the held write data.

According to another aspect of the semiconductor integrated circuit in the present invention, the semiconductor integrated circuit comprises a bit line connected with the memory cells, a switching circuit and a data masking circuit.

The switching circuit connected with the bit line transmits the held write data to the bit line. The data masking circuit controls the switching circuit in accordance with the held mask information and masks a predetermined bit of the held write data.

The data masking circuit thus controls not the held write data but the switching circuit for masking data.

According to another aspect of the semiconductor integrated circuit in the present invention, the semiconductor integrated circuit comprises an address holding part, an address comparing part, and a data selecting part.

The address holding part holds a write address supplied corresponding to the write command as a held write address. The address comparing part compares the held write address with a read address supplied corresponding to a read command. The data selecting part respectively selects a predetermined bit of read data from the memory cells and a predetermined bit of the held write data in accordance with the held mask information when the comparison result from the address comparing part indicates the coincidence of the both addresses.

In this semiconductor integrated circuit, write data has not yet written to the memory cells but is held in the holding unit immediately after a write operation. Therefore, when a read operation is performed on the same address immediately after the write operation, the data held in the holding unit need to be output as read data in the read operation. Meanwhile, in case where part of the write data is masked, the masked data is not to be written to the memory cells. Regarding those masked bits, therefore, it is necessary to read the data held in the memory cells instead of the data held in the holding unit.

This semiconductor integrated circuit allows proper data read operation even when a read operation is performed on the same address immediately after a write operation.

According to another aspect of the semiconductor integrated circuit in the present invention, the semiconductor integrated circuit comprises memory cells, a data masking circuit, and a holding unit.

The data masking circuit receives write data and mask information supplied corresponding to a write command, and masks a predetermined bit of the write data in accordance with the mask information. The holding unit holds data masked by the data masking circuit as held mask data. On receiving a next write command, the semiconductor integrated circuit writes the held mask data to the memory cells. The holding unit holds mask data, as the held mask data, generated from next write data supplied corresponding to this write command. In other words, the held mask data are rewritten.

This makes it possible to mask write data in the semiconductor integrated circuit in which write data previously accepted is written upon the reception of a next write command.

In addition, the mask data are generated before the holding unit. That is, it is possible to perform a mask control in a part close to an input circuit. This consequently minimizes the operation of the internal circuit, allowing a reduction in the power consumption.

According to another aspect of the semiconductor integrated circuit in the present invention, the semiconductor integrated circuit comprises an address holding part, an address comparing part, and a data selecting part.

In this semiconductor integrated circuit as described above, the data selecting part allows proper data read operation even when a read operation is performed on the same address immediately after a write operation.

According to one of the aspects of the method of controlling a semiconductor integrated circuit in the present invention, write data to memory cells and mask information used for masking a predetermined bit of the write data, both supplied corresponding to a write command, are held as held write data and held mask information. When a next write command is received, the held write data are masked in accordance with the held mask information and are written to the memory cells. Next write data and next mask information supplied corresponding to the write command are held as the held write data and the held mask information. In other words, the held write data and the held mask information are rewritten.

This makes it possible to mask write data in the semiconductor integrated circuit in which write data previously accepted is written upon the reception of a next write command.

BRIEF DESCRIPTION OF THE DRAWINGS

The nature, principle, and utility of the invention will become more apparent from the next detailed description when read in conjunction with the accompanying drawings in which like parts are designated by identical reference numbers, in which.

DESCRIPTION OF THE PREFERRED EMBODIMENTS

Figure 1:
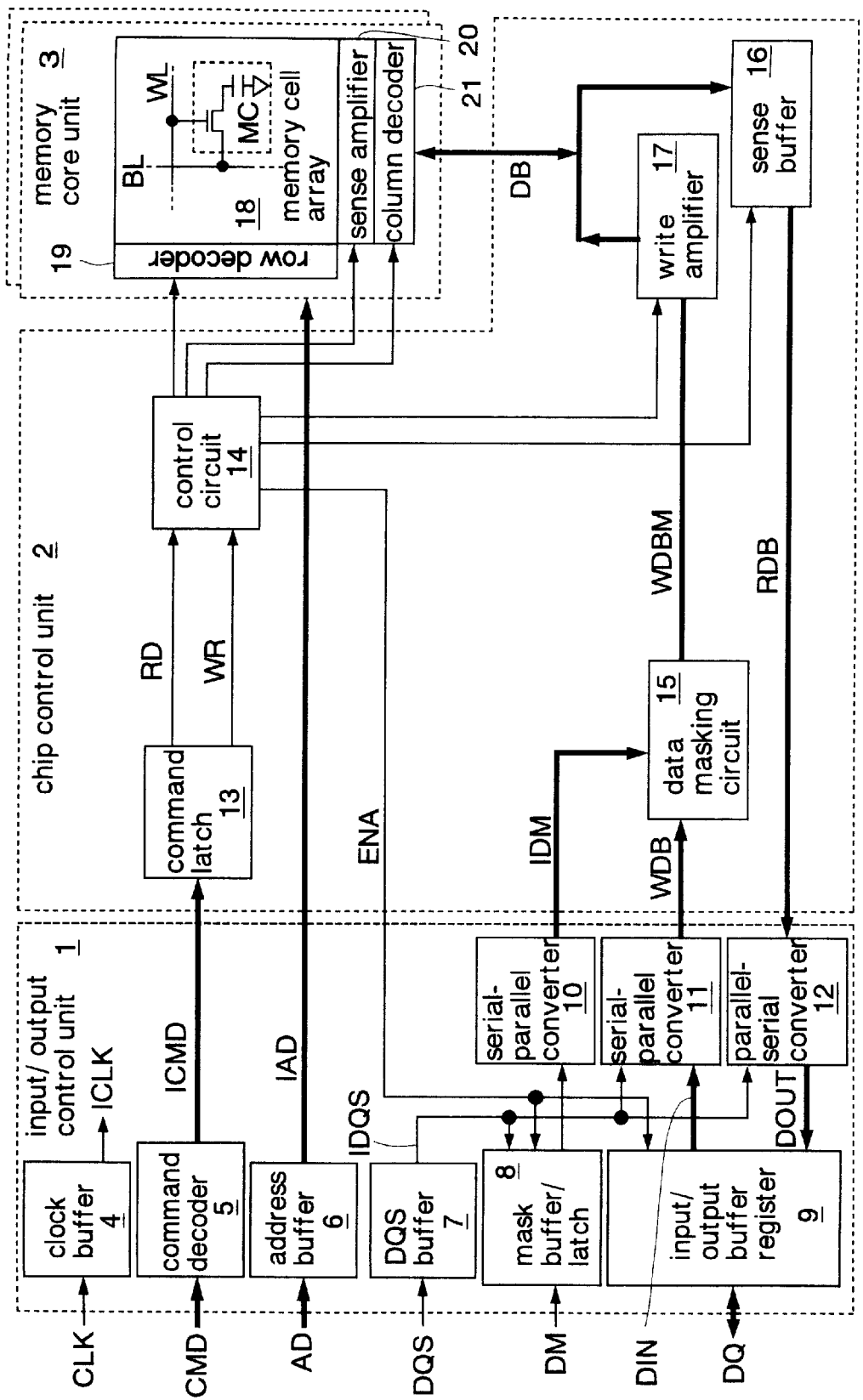
FIG. 1 is a block diagram showing a conventional SDRAM.
Figure 2:
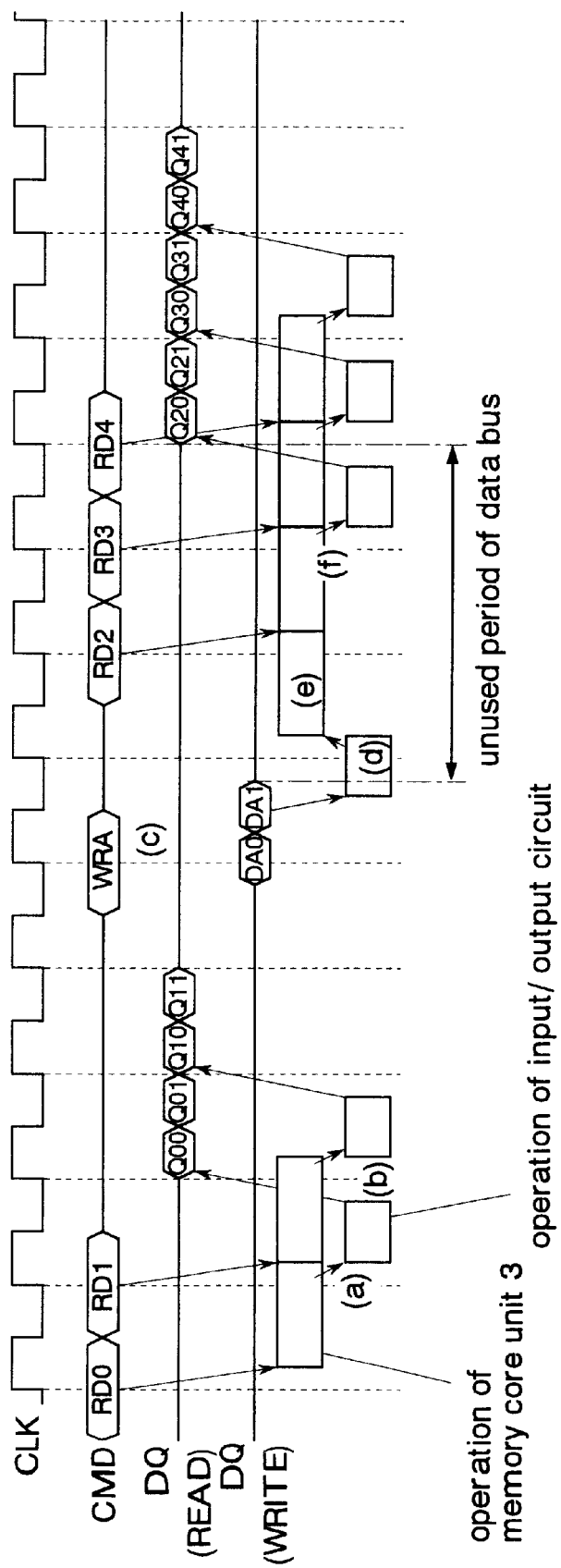
FIG. 2 is a timing chart showing the operation of the SDRAM in FIG. 1.
Figure 3:
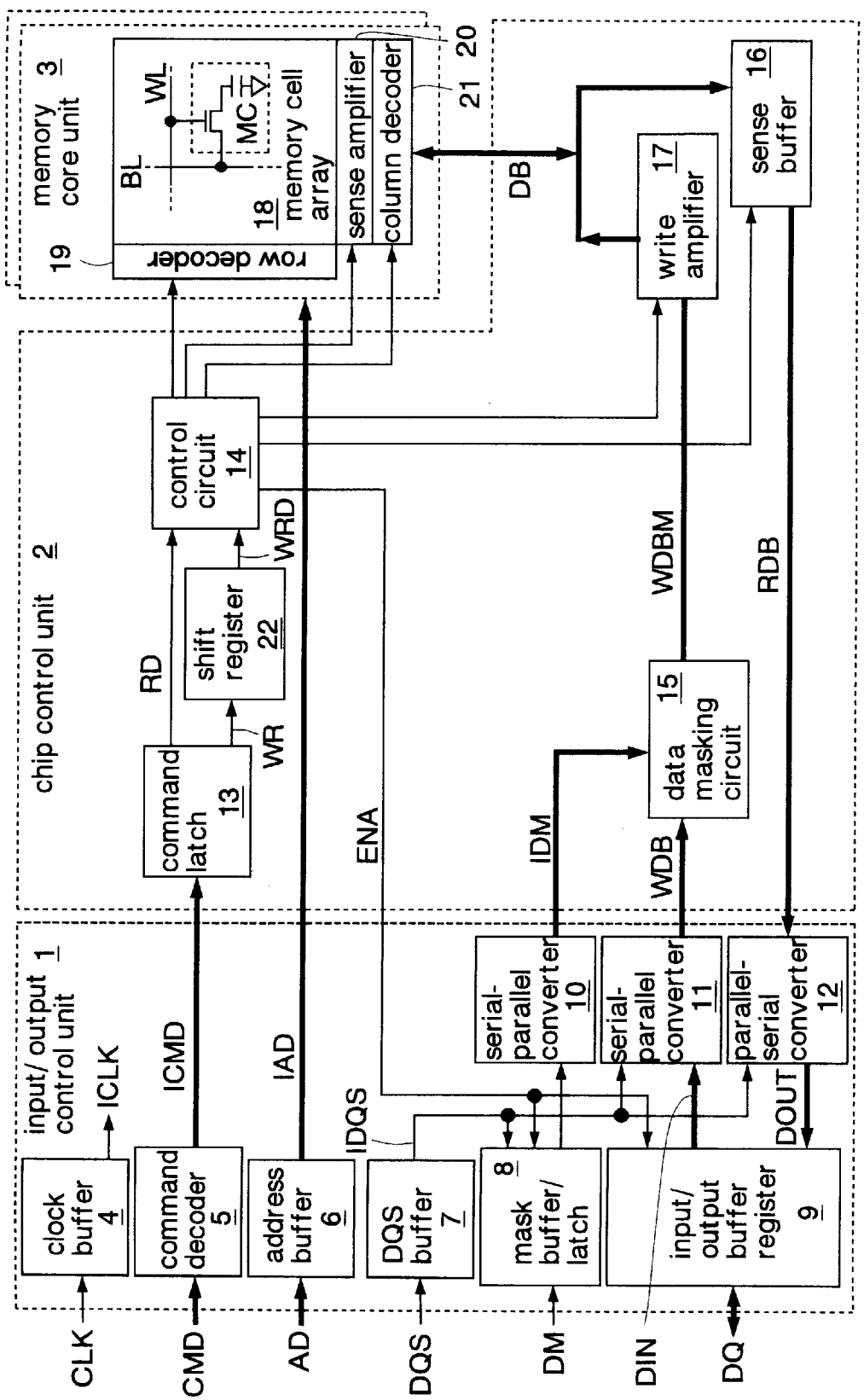
FIG. 3 is a block diagram showing another example of the conventional SDRAM.
Figure 4:
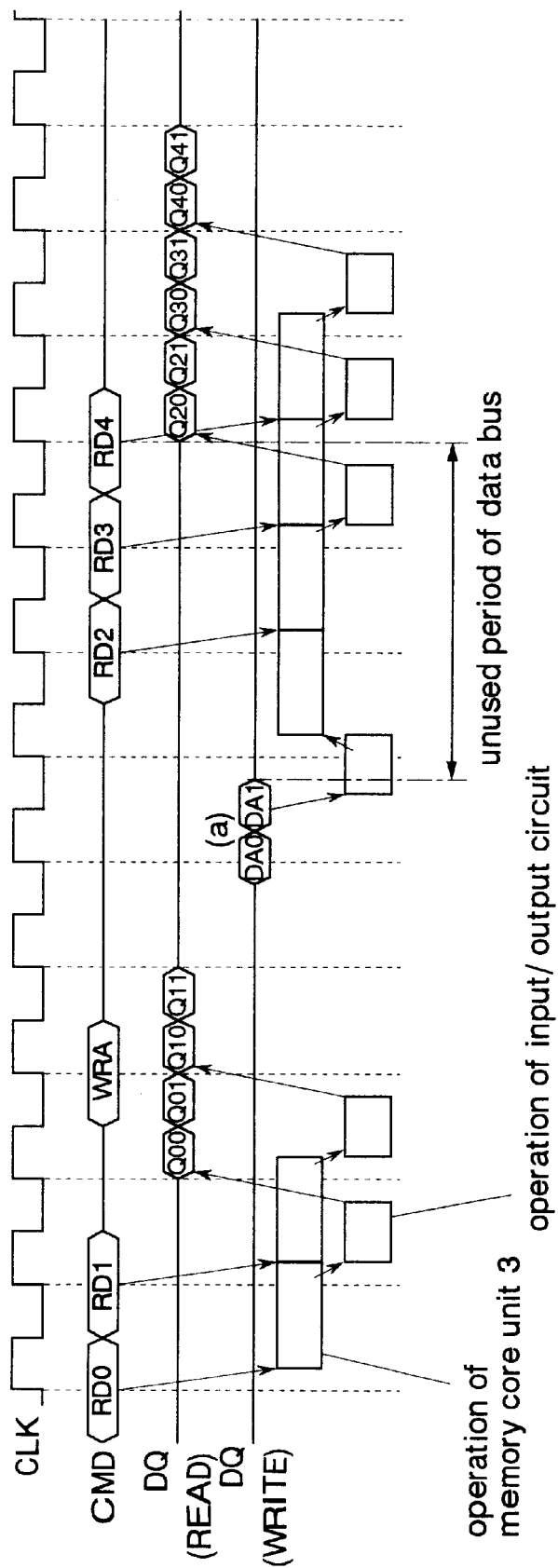
FIG. 4 is a timing chart showing the operation of the SDRAM in FIG. 3.

Hereinafter, the embodiments of the present invention will be described with reference to the accompanying drawings. In the drawings, those signal lines shown by thick lines each comprise a plurality of lines. Some of the circuits connected with the thick lines consist of a plurality of components.

Figure 6:
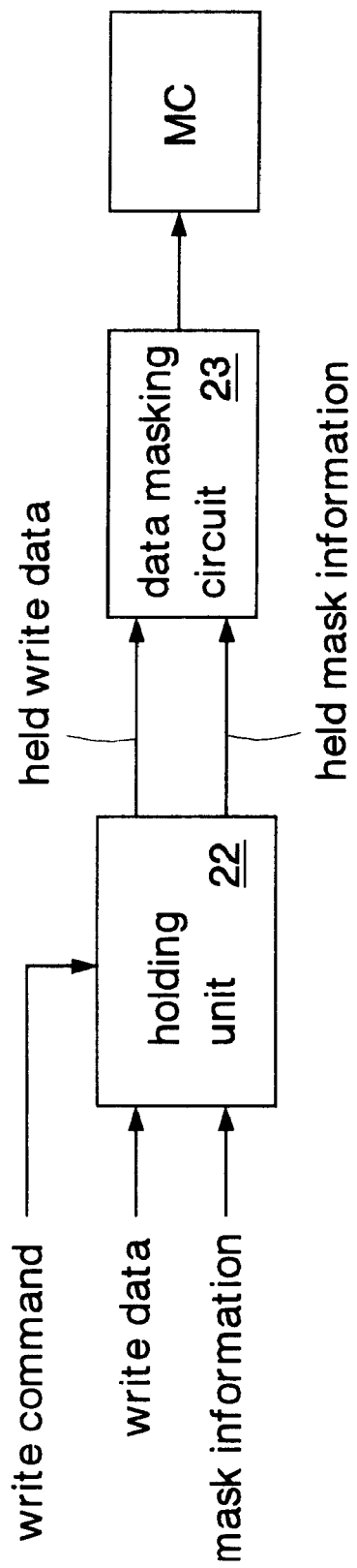
FIG. 6 is a block diagram showing the basic principles of the semiconductor integrated circuit according to the present invention.

FIG. 6 is a block diagram showing the basic principles of the semiconductor integrated circuit according to the present invention.

The semiconductor integrated circuit comprises memory cells MC, a holding unit 22, and a data masking circuit 23.

The holding unit 22 holds write data to the memory cells MC and mask information for masking a predetermined bit or bits of the write data, both supplied corresponding to a write command, as held write data and held mask information, respectively. The data masking circuit 23 receives the held write data and the held mask information output from the holding unit 22. On receiving the next write command, the semiconductor integrated circuit masks the held write data in accordance with the held mask information, and writes the resultant to the memory cells MC. The holding unit 22 holds the next write data and the next mask information supplied corresponding to the write command as the held write data and the held mask information.

Figure 7:
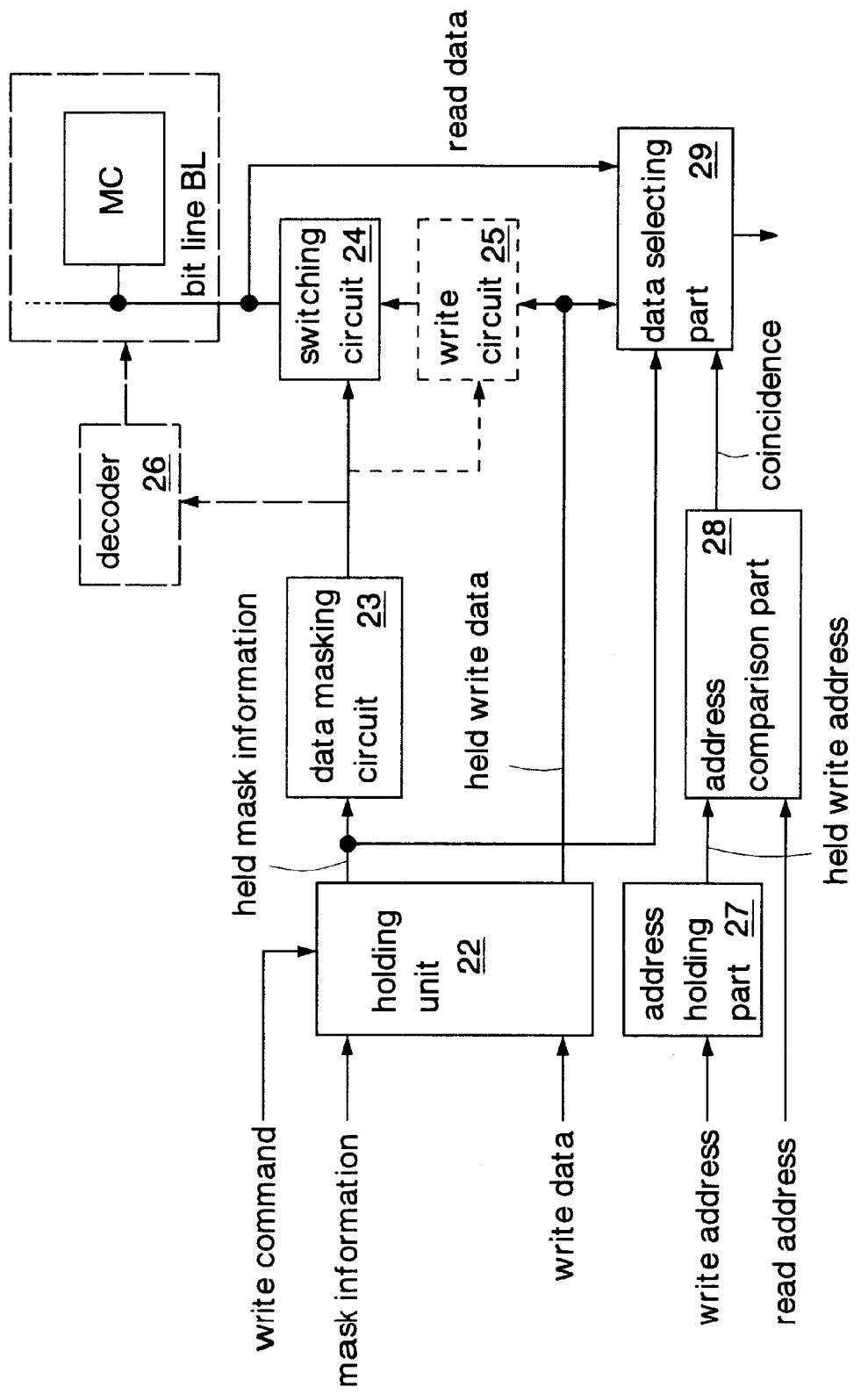
FIG. 7 is another block diagram showing the basic principles of the semiconductor integrated circuit according to the present invention.

FIG. 7 is another block diagram showing the basic principles of the semiconductor integrated circuit according to the present invention.

The semiconductor integrated circuit comprises a bit line BL connected with the memory cells MC the holding unit 22, a switching circuit 24, a write circuit 25, and the data masking circuit 23.

The switching circuit 24, connected with the bit line BL, transmits the held write data to the bit line BL. The write circuit 25 supplies the held write data to the switching circuit 24. The data masking circuit 23 controls the write circuit 25 in accordance with held mask information so as to mask a predetermined bit or bits of the held write data.

The semiconductor integrated circuit comprises a decoder 26 for selecting the memory cells to be written the held write data. The data masking circuit 23 controls the decoder 26 in accordance with the held mask information so as to mask a predetermined bit or bits of the held write data.

The semiconductor integrated circuit also comprises an address holding part 27, an address comparing part 28, and a data selecting part 29.

The address holding part 27 holds a write address supplied corresponding to a write command, as a held write address. The address comparing part 28 compares the held write address with a read address supplied corresponding to a read command. The data selecting part 29 selects a predetermined bit or bits of both the read data from the memory cells MC and the held write data in accordance with the held mask information when the comparison result from the address comparing part 28 indicates the coincidence of the addresses.

Figure 8:
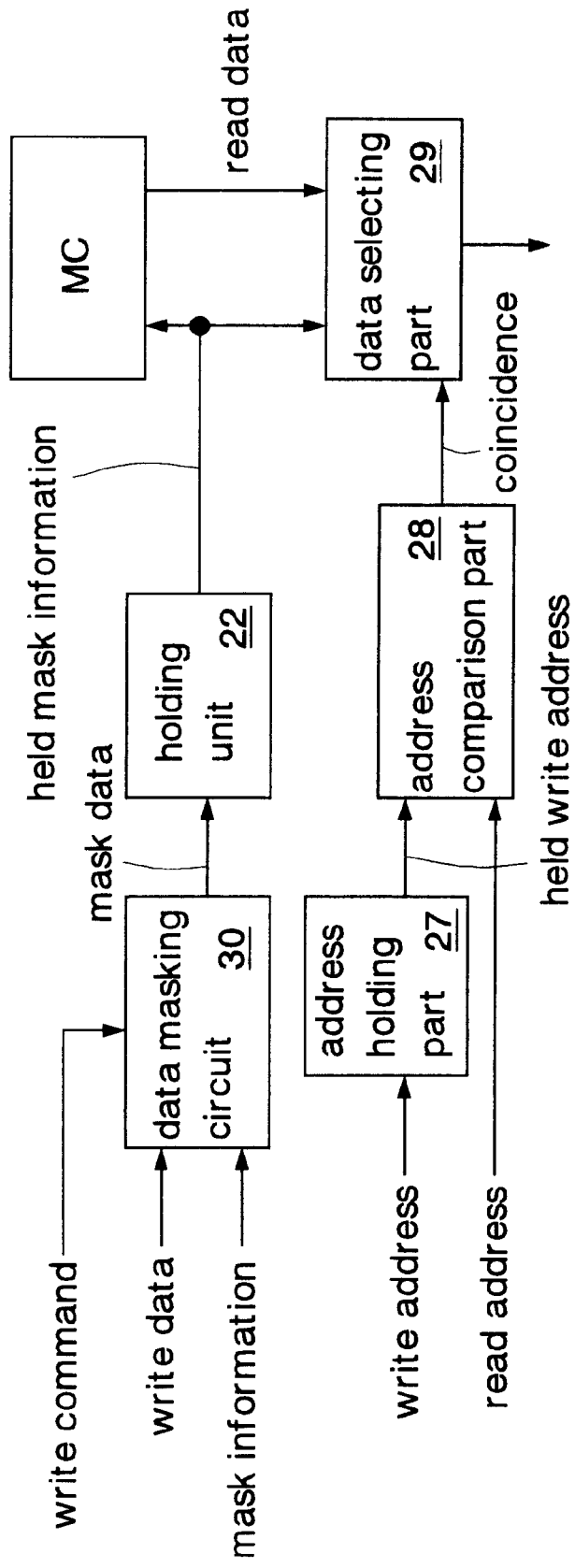
FIG. 8 is another block diagram showing the basic principles of the semiconductor integrated circuit according to the present invention.

FIG. 8 is another block diagram showing the basic principles of the semiconductor integrated circuit according to the present invention.

The semiconductor integrated circuit comprises the memory cells MC, a data masking circuit 30, and the holding unit 22.

The data masking circuit 30 receives write data and mask information supplied corresponding to a write command, and masks a predetermined bit or bits of the write data in accordance with the mask information. The holding unit 22 holds the mask data masked by the data masking circuit 30 as held mask data. On receiving the next write command, the semiconductor integrated circuit writes the held mask data to the memory cells MC. The holding unit 22 holds the mask data generated from the next write data supplied corresponding to this write command, as held mask data.

The semiconductor integrated circuit also comprises the address holding part 27, the comparing part 28, and the data selecting part 29.

As in the semiconductor integrated circuit shown in FIG. 7, the data selecting part 29 in this semiconductor integrated circuit ensures proper data read even when a read operation is performed immediately after a write operation to the same address.

Figure 9:
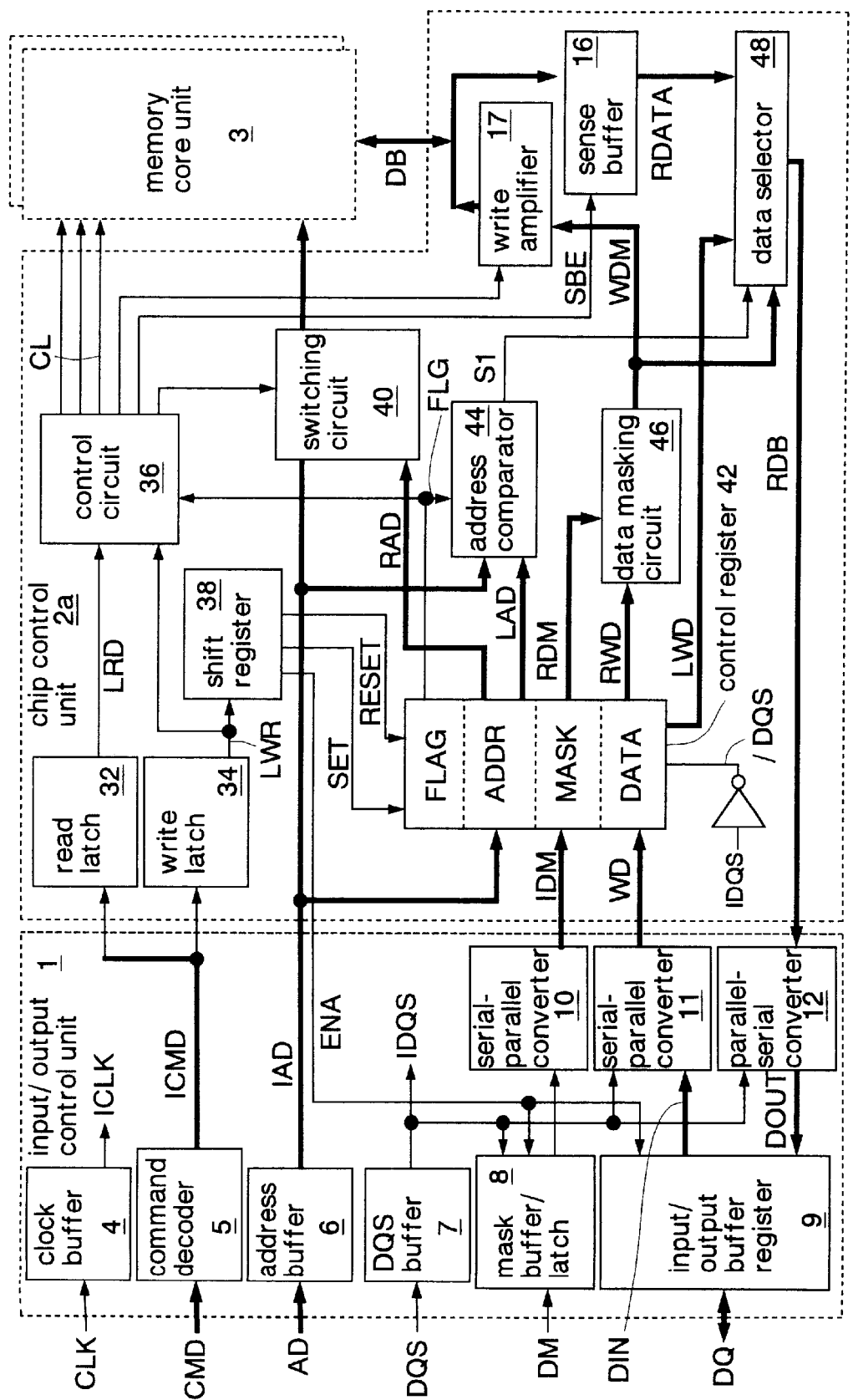
FIG. 9 is a block diagram showing a first embodiment of the semiconductor integrated circuit and the method of controlling the semiconductor integrated circuit according to the present invention.

FIG. 9 shows a first embodiment of the semiconductor integrated circuit the method of controlling a semiconductor integrated circuit according to the present invention. The same circuits as those described in the conventional art will be designated by identical reference numbers, and detailed description thereof will be omitted here.

The semiconductor integrated circuit in this embodiment is formed as a DDR SDRAM (hereinafter, also simply referred to as SDRAM) on a silicon substrate by using CMOS process technology. This semiconductor integrated circuit comprises an input/output control unit 1, a chip control unit 2a, and memory core units 3. If the SDRAM consists of a plurality of banks, a group of the chip control unit 2a and the memory core units 3 are provided for each of the banks.

The input/output control unit 1 and the memory core units 3 have the same configuration as that of FIG. 1. The SDRAM in this embodiment does not adapt an address multiplex type; therefore, the address signal AD is supplied once in every read operation and in every write operation.

The chip control unit 2a comprises a read latch 32, a write latch 34, a control circuit 36, a shift register 38, a switching circuit 40, a control register 42, an address comparator 44, a data masking circuit 46, a write amplifier 17, a sense buffer 16, and a data selector 48. Here, the control register 42 corresponds to the holding unit 22 shown in FIG. 6. The address comparator 44 and the data selector 48 correspond to the address comparing part 27 and the data selecting part 29 shown in FIG. 7.

The read latch 32 and the write latch 34 latch predetermined internal command signals ICMD, and output the latched signals as a latched read signal LRD and a latched write signal LWR, respectively.

The control circuit 36 receives the LRD signal and the LWR signal, and outputs a plurality of timing signals. The timing signals are supplied to the switching circuit 40, the sense buffer 16, the write amplifier 17, and the memory core units 3.

The shift register 38 receives the LWR signal and the not-shown ICLK signal, and outputs a set signal SET, a reset signal RESET, and an enable signal ENA.

The switching circuit 40 outputs either an internal address signal IAD or a registered address signal RAD to the memory core units 3 in accordance with the timing signal from the control circuit 36.

The control register 42 consists of a flag part FLAG, an address holding part ADDR, a mask holding part MASK, and a data holding part DATA.

The flag part FLAG receives the SET signal and the RESET signal, and outputs a flag signal FLG.

The address holding part ADDR receives the IAD signal, the SET signal, and the LWR signal not shown, and outputs a latched address signal LAD and the registered address signals RAD and /RAD. Signals marked with "/" are of negative logic. The LAD signal and the RAD and/RAD signals correspond to the held write address shown in FIG. 7.

The mask holding part MASK receives the internal data mask signal IDM, the SET signal, and the inverted signal /DQS of the IDQS signal through an inverter and outputs a registered mask signal RDM. The DM signal and the IDM signal correspond to the mask information shown in FIG. 6, and the RDM signal corresponds to the held mask information.

The data holding part DATA receives a write data signal WD, the SET signal, and the/DQS signal and outputs a latched write data signal LWD and a registered write data signal RWD. Here, the LWD signal and the RWD signal correspond to the held write data shown in FIG. 6.

When the FLG signal is at high level in a read operation, the address comparator 44 makes a comparison between the internal address signal IAD and the latched address signal LAD, and outputs a coincidence signal S1 when both the signals coincide with each other.

The data masking circuit 46 masks a predetermined bit or bits of the RWD signal according to the information of the RDM signal, and outputs the masked data as a write data mask signal WDM. In this embodiment, the RDM signal consists of two bits, RDMa and RDMb. The data signal DQ consists of eight bits. The WDM signal consists of 16 bits, WDMa0–WDMa7 and WDMb0–WDMb7. When the RDMa signal is at high level, the WDMa0–WDMa7 signals are masked. When the RDMb signal is at high level, the WDMb0–WDMb7 signals are masked.

That is, the data masking circuit 46 itself masks the write data in this embodiment.

The data selector 48 receives the S1 signal and the complementary WDM signals. In accordance with the states of these signals, the data selector 48 selects a predetermined bit or bits of an RDATA signal and a predetermined bit or bits of the LWD signal, and outputs them as the RDB signal.

Figure 10:
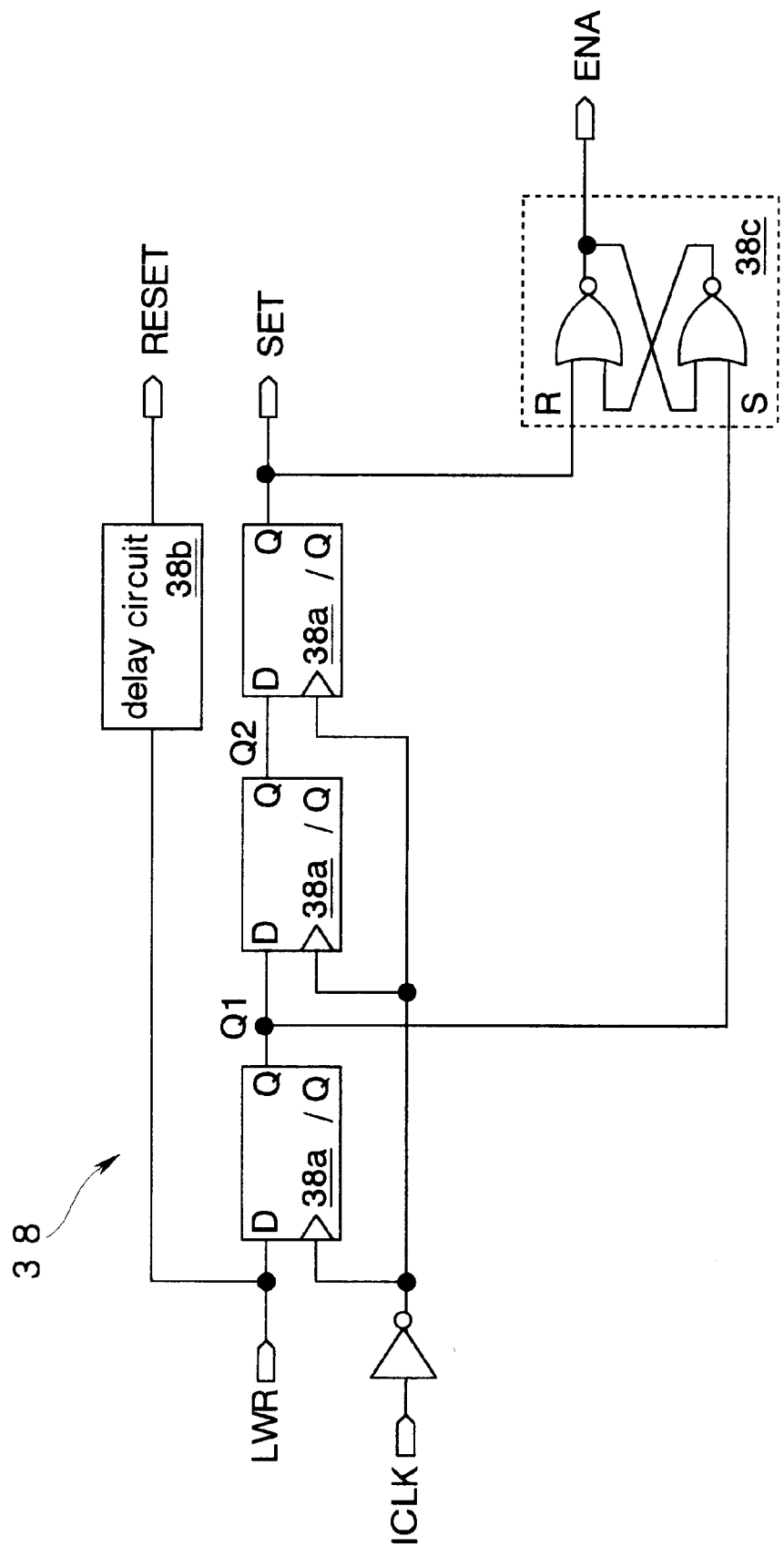
FIG. 10 is a circuit diagram showing the shift register in FIG. 9.

FIG. 10 shows the details of the shift register 38.

The shift register 38 comprises three D flip-flops 38a connected in series, a delay circuit 38b, and an RS flip-flop 38c.

Each of the D flip-flops 38a is supplied with the inverted signal of the ICLK signal. The D flip-flop 38a at the initial stage accepts the LWR signal in synchronization with the falling edge of the ICLK signal. The D flip-flop 38a at the final stage outputs the SET signal. The delay circuit 38b receives the LWR signal, delays the received signal by a predetermined time, and outputs the resultant as the RESET signal. The RS flip-flop 38c receives the output signal Q1 of the initial-stage D flip-flop 38a at its set terminal S, receives the SET signal at its reset terminal R, and outputs the ENA signal.

Figure 11:
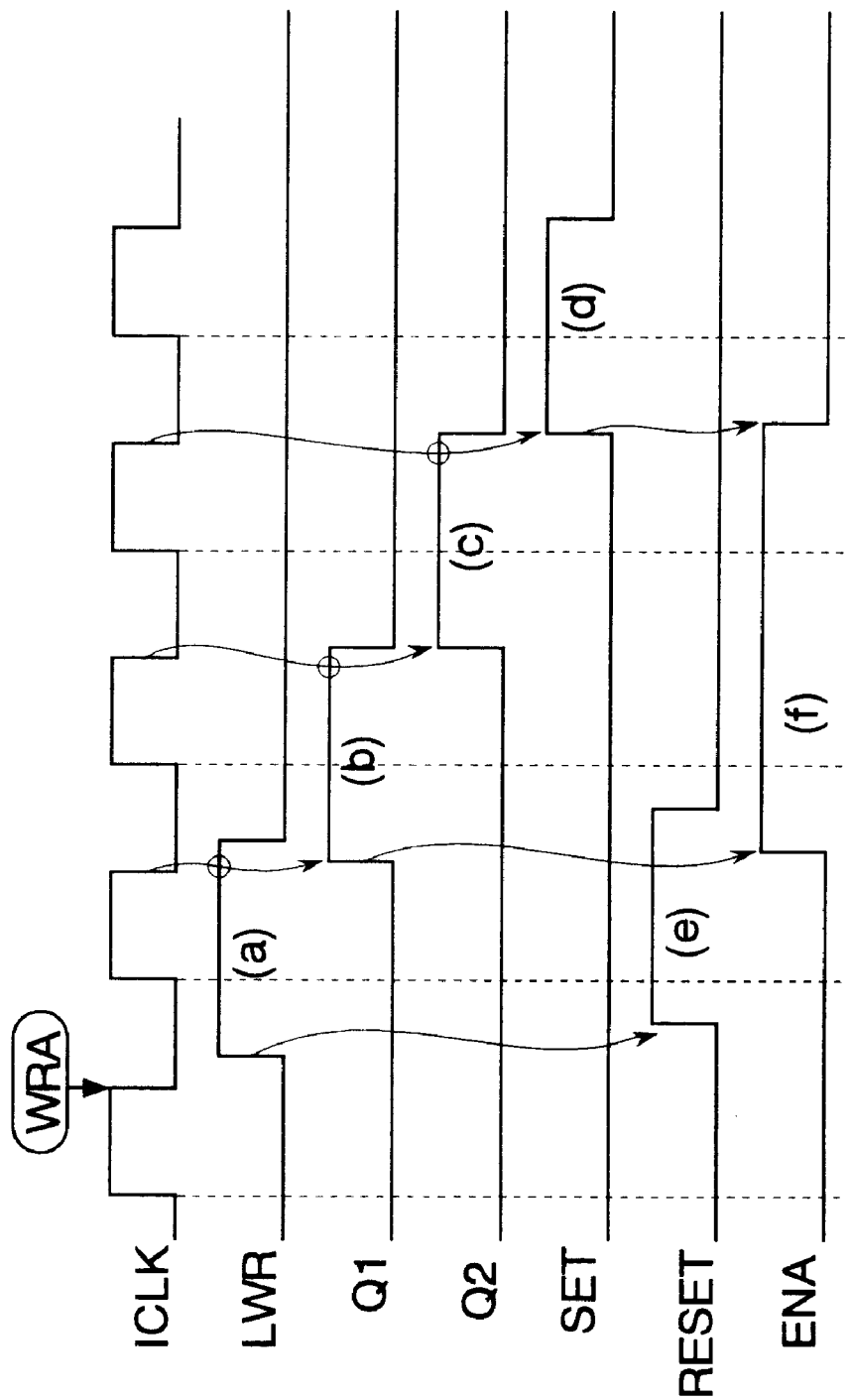
FIG. 11 is a timing chart showing the operation of the shift register in FIG. 10.

FIG. 11 shows the operation of the shift register 38.

Initially, in synchronization with the ICLK signal receiving a write command WRA, the LWR signal turns to high level for a period of approximately one clock (FIG. 11(a)). In synchronization with the next falls of the ICLK signal, the Q1 signal, the Q2 signal, and the SET signal sequentially turn to high level for a period of approximately one clock (FIG. 11(b), (c), and (d)). The RESET signal lags by the delay time of the delay circuit 38b behind the LWR signal in turning to high level (FIG. 11(e)). The ENA signal turns to high level for the period from the rising edge of the Q1 signal to the rising edge of the SET signal (FIG. 11(f)).

Figure 12:
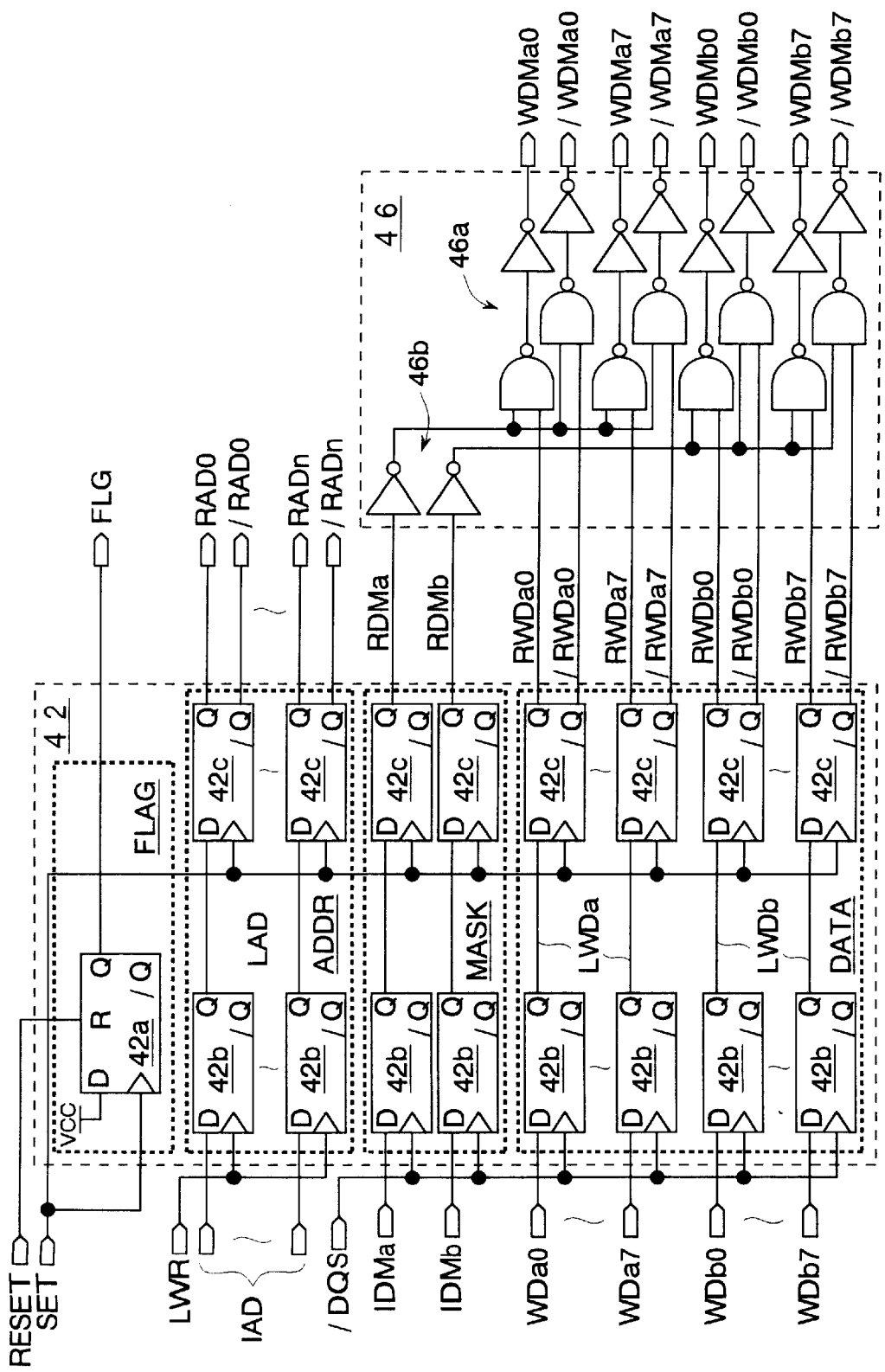
FIG. 12 is a circuit diagram showing the control register and the data masking circuit in FIG. 9.

FIG. 12 shows the details of the control register 42 and the data masking circuit 46.

The flag part FLAG of the control register 42 consists of a D flip-flop 42a having a reset terminal R. The D flip-flop 42a outputs the FLG signal of high level in synchronization with the SET signal. The input terminal D is connected with a power supply line VCC, and the reset terminal R receives the RESET signal.

The address holding part ADDR of the control register 42 comprises a plurality of pairs of D flip-flops 42b and 42c connected in series. The D flip-flops 42b at the prior stages accept an IAD signal in synchronization with the LWR signal, and output the accepted signal as the LAD signal. The D flip-flops 42c at the subsequent stages accept the LAD signal in synchronization with the SET signal, and respectively output the accepted signal as RAD0–RADn signals and /RAD0–/RADn signals.

The mask holding part MASK of the control register 42 comprises two pairs of D flip-flops 42b and 42c connected in series. The D flip-flops 42b at the prior stages accept the IDM signal (IDMa, IDMb) in synchronization with the /DQS signal, and output the accepted signal as a mask signal. The D flip-flops 42c at the subsequent stages accept the mask signal from the prior stages in synchronization with the SET signal, and output the accepted signal as the RDMa and RDMb signals.

The data holding part DATA of the control register 42 comprises a plurality of pairs of D flip-flops 42b and 42c connected in series. The D flip-flops 42b at the prior stages accept the WD signal (WDa0–WDa7, WDb0–WDb7), and output the accepted signal as the 16-bit LWD signal (LWDa, LWDb). The D flip-flops 42c at the subsequent stages accept the LWD signal in synchronization with the SET signal, and output the accepted signal as the RWD signal (RWDa0–RWDa7, RWDb0–RWDb7) and the /RWD signal (/RWDa0–/RWDa7, /RWDb0–/RWDb7).

The data masking circuit 46 comprises a plurality of AND circuits 46a for receiving the RWDa, RWDb, /RWDa, and /RWDb signals, respectively, and two inverters 46b for receiving the RDMa and RDMb signals, respectively.

When the RDMa signals are at low level (a non-masked state), the AND circuits 46a for receiving the RWDa signals output the RWDa and /RWDa signals as the WDMa and /WDMa signals (WDMa0–WDMa7, /WDMa0–/WDMa7). Both the WDMa and /WDMa signals are to be turned to low level when the RDMa signals are at high level (a masked state). When the RDMb signals are at low level (a non-masked state), the AND circuits 46a receiving the RWDb signals output the RWDb and /RWDb signals as the WDMb and /WDMb signals (WDMb0–WDMb7, /WDMb0–/WDMb7). Both the WDMb and /WDMb signals are to be turned to low level when the RDMb signals are at high level (a masked state).

Figure 13:
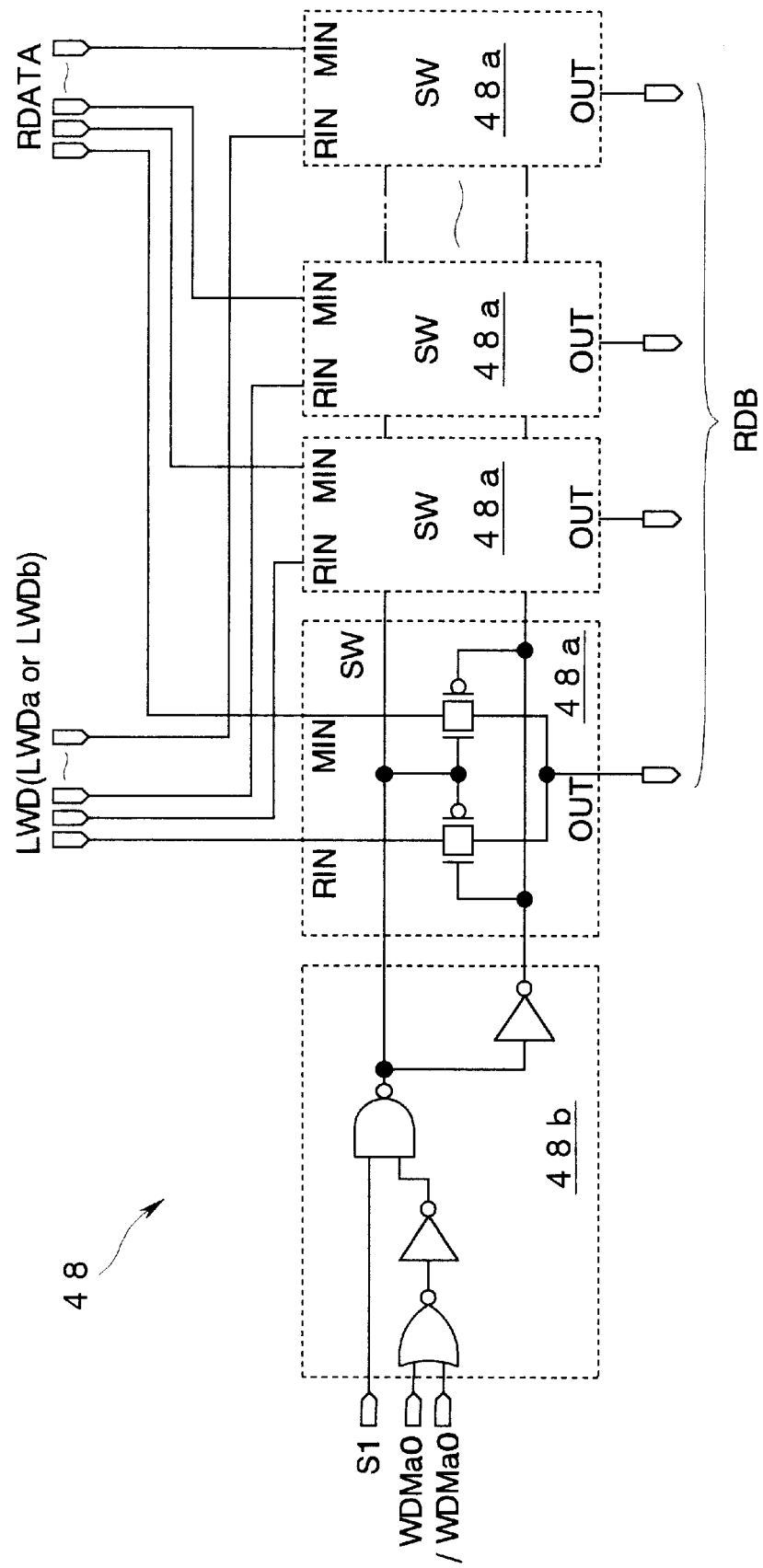
FIG. 13 is a circuit diagram showing the data selector in FIG. 9.

FIG. 13 shows the details of the data selector 48.

The data selector 48 has two units each consisting of a plurality of switching circuits 48a and a combinational circuit 48b. The units are respectively used for LWDa signal and LWDb signal.

A switching circuit 48a consists of two CMOS transmission gates each having an nMOS and a pMOS whose sources and drains are connected with each other. The outputs of the CMOS transmission gates are connected with each other. The input terminal RIN of one of the CMOS transmission gates is supplied with the LWD signal. The input terminal MIN of the other CMOS transmission gate is supplied with the RDATA signal.

The combinational circuit 48b turns on those CMOS transmission gates in the side of MIN-terminal when the coincidence signal S1 is at low level (addresses not coincident) or both the WDMa0 signal and the /WDMa0 signal are at low level (mask required). In contrast, the combinational circuit 48b turns on those CMOS transmission gates in the side of RIN terminal when the coincidence signal S1 is at high level (addresses coincident) and both the WDMa0 signal and the /WDMa0 signal are at high level (mask not required). In this embodiment, the data masking is performed on every 8-bit. Therefore, the combinational circuit 48b in each unit has only to be supplied with the WDM and /WDM signals corresponding to any one of the bits.

Note that the data selector 54 operates only in read operations, under a not shown control signal.

Now, description will be given of the operation of the above-described SDRAM.

Figure 14:
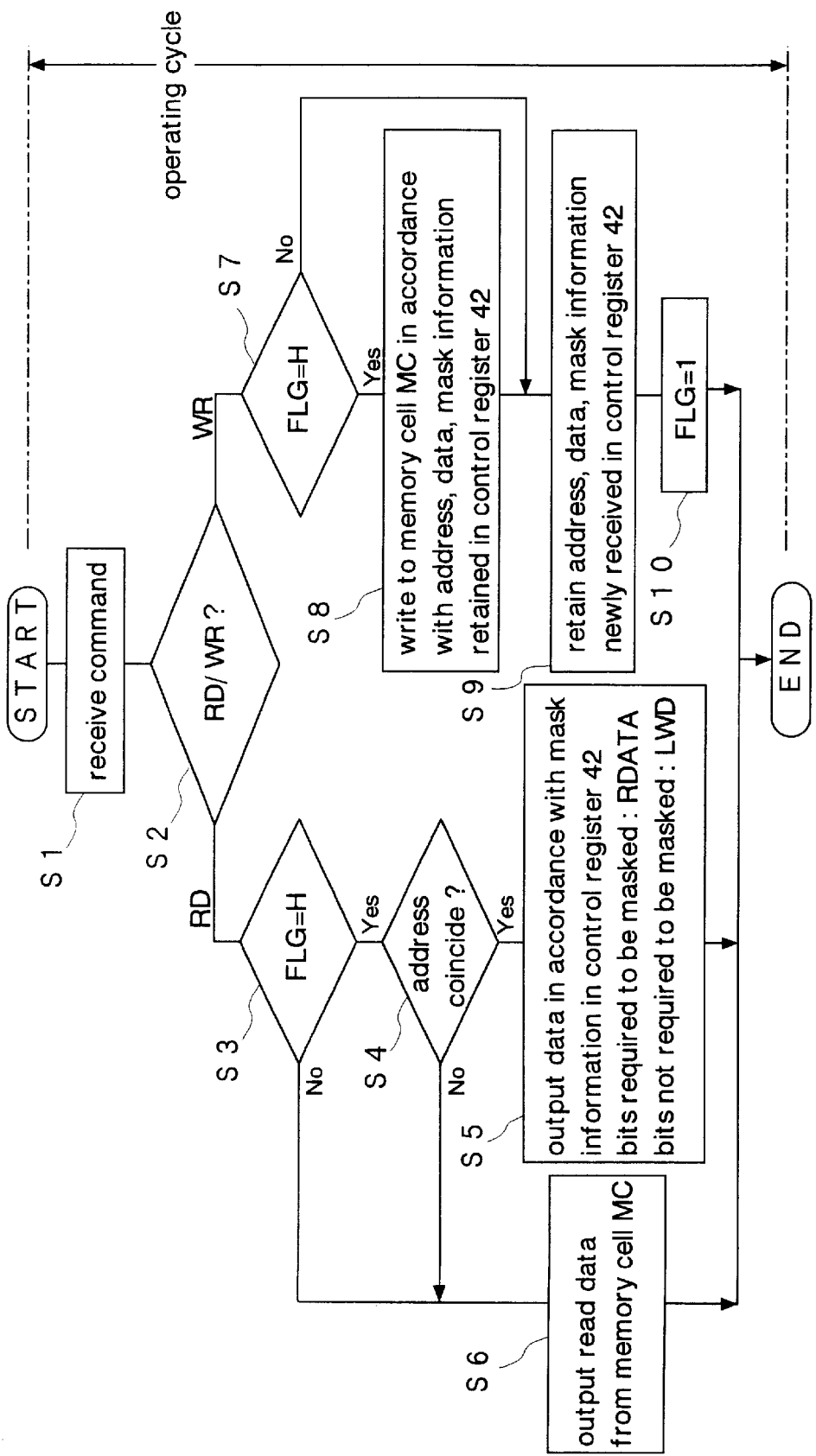
FIG. 14 is a flowchart showing the control in an operating cycle of the SDRAM in the first embodiment.

FIG. 14 shows the control flow in an operating cycle of the SDRAM.

Initially, at step S1, the SDRAM receives a command.

Then, at step S2, the command received is judged whether it is a read command RD or a write command WR. If it is judged to be the read command RD, the procedure moves to step S3. If it is judged to be the write command WR, the procedure moves to step S7. Here, the steps S3–S6 indicate a flow of the read operation and the steps S7–S10 indicate a flow of the write operation.

At step S3, the FLG signal is judged whether it is at high level or not. When the control register shown in FIG. 9 holds data, the FLG signal is at high level. The procedure moves to step S4. When the control register 42 holds no valid data, the FLG signal is at low level. The procedure moves to step S6. After the judgement at step S3, the control register 42 receives the RESET signal and reset the FLG signal.

At step S4, the address comparator 44 compares the IAD signal with the LAD signal, judging whether or not the two addresses coincide with each other. If the addresses coincide, the address comparator 44 outputs the coincidence signal S1, and the procedure moves to step S5. Here, data to be read have not yet written to the memory cells MC but are held in the control register 42. If the addresses do not coincide with each other, the procedure moves to step S6. In this case, the data to be read are stored in the memory cells MC.

At step S5, in accordance with the mask information (the RDM signal), the data selector 48 outputs the RDATA signal from the memory cells MC for bits required to be masked and outputs the LWD signal latched in the control register 42 for bits not required to be masked. Consequently, data on bits required to be masked among the write data corresponding to the most previous write command WR are read out from the memory cells MC. Then, the operating cycle is completed.

On the other hand, at step S6, a normal read operation is performed to output read data (the RDATA signal) from the memory cells MC. Then, the operating cycle is completed.

In a write operation, the FLG signal is judged whether or not it is at high level at step S7. When the FLG signal is at high level, the procedure moves to step S8. Here, the data accepted upon the previous write command WR are held in the control register 42. When the FLG signal is at low level, the procedure moves to step S9. In this case, no valid data are held in the control register 42. After the judgement at step S7, the control register 42 receives the RESET signal and reset the FLG signal.

At step S8, the SDRAM performs a data write operation on the memory cells MC in accordance with the address (RAD), the data (RWD), and the mask information (RDM) held in the control register 42. Then, the procedure moves to step S9.

At step S9, the control register 42 accepts the address (IAD), the data (WD), and the mask information (DM) newly received corresponding to the write command WR. In other words, the contents of the control register 42 are rewritten. The rewritten data is to be written to the memory cells MC in synchronization with the next write command WR.

At step S10, the control register 42 holding the new valid data, receives the SET signal and set the FLG signal at high level. Then, the operating cycle is completed.

Figure 15:
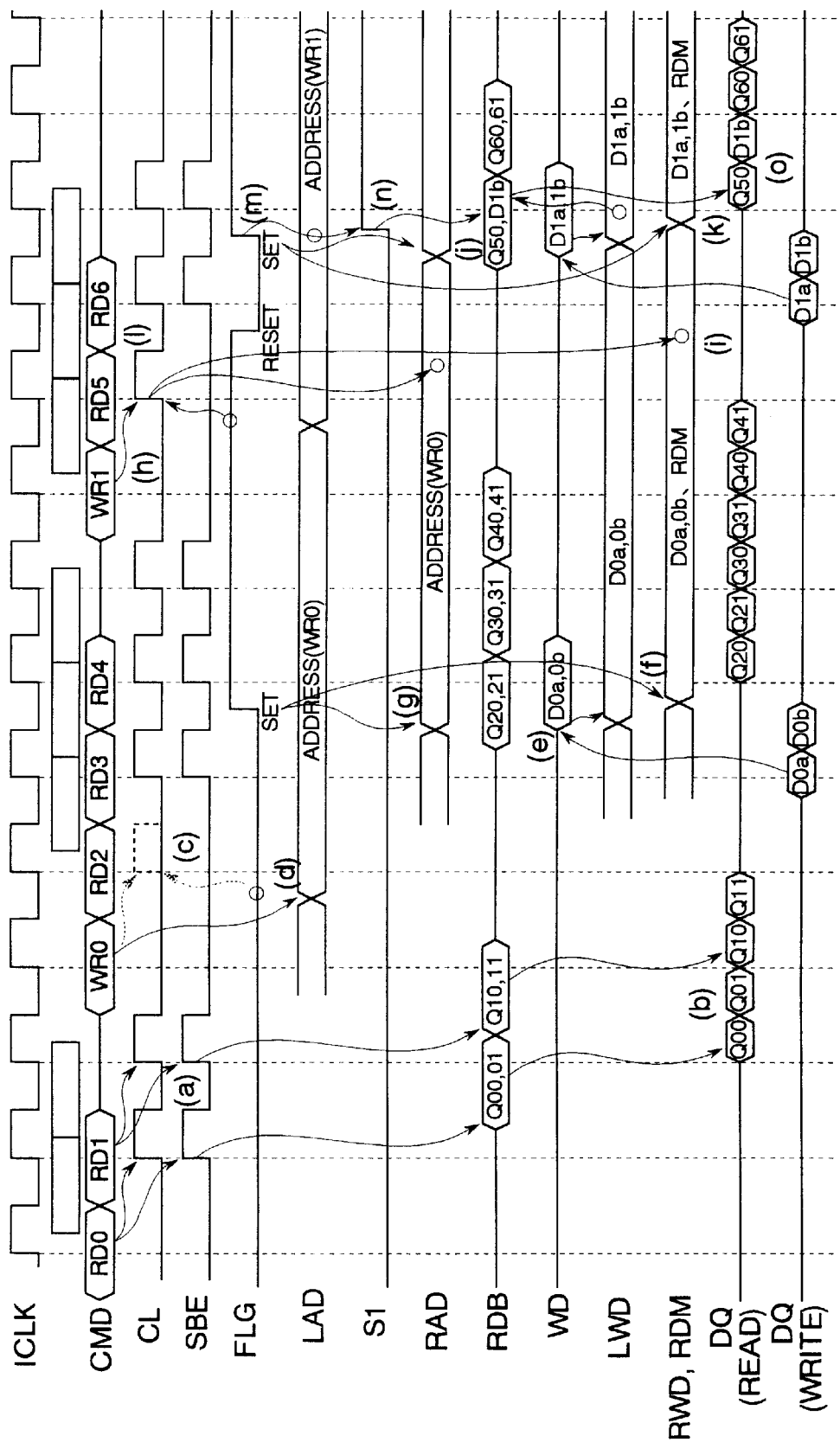
FIG. 15 is a timing chart showing the operation of the SDRAM in the first embodiment.

FIG. 15 shows an example where the SDRAM described above performs write operations in between read operations. In this example, both the read latency and the write latency are "2". The rectangles shown below the ICLK signal indicate the periods where the memory core units 3 operate.

Initially, read commands RD0 and RD1 are sequentially supplied so that a column control signal CL and a sense buffer enable signal SBE are sequentially activated (FIG. 15(a)). Then, the data read from the memory cells MC are transmitted as RDB signals and sequentially output as DQ signals (FIG. 15(b)).

Two clocks after the reception of the read command RD1, the first write command WR0 is supplied. At this moment, the control register 42 is holding no valid data, and the FLG signal is set at low level. Therefore, the control circuit 36 will not activate the CL signal (FIG. 15(c)). An address signal AD for write (not shown) supplied along with the write command WR0 is latched into the control register 42, generating the LAD signal (FIG. 15(d)).

Write data D0a and D0b are supplied two clocks after the write command WR0. In the serial-parallel converter 11, the write data D0a and D0b are converted into a write data signal WD of parallel form (FIG. 15(e)). The converted WD signal is latched into the control register 42 in synchronization with the rising edge of the /DQS signal (now shown). Here, the data mask signal DM is also latched into the control register 42. Those latched signals are held into the D flip-flops 42c of the control register 42 in synchronization with the activation of the SET signal. The held signals are output as the RAD signal, the RWD signal, and the RDM signal, respectively (FIG. 15(f) and (g)).

Figure 5:
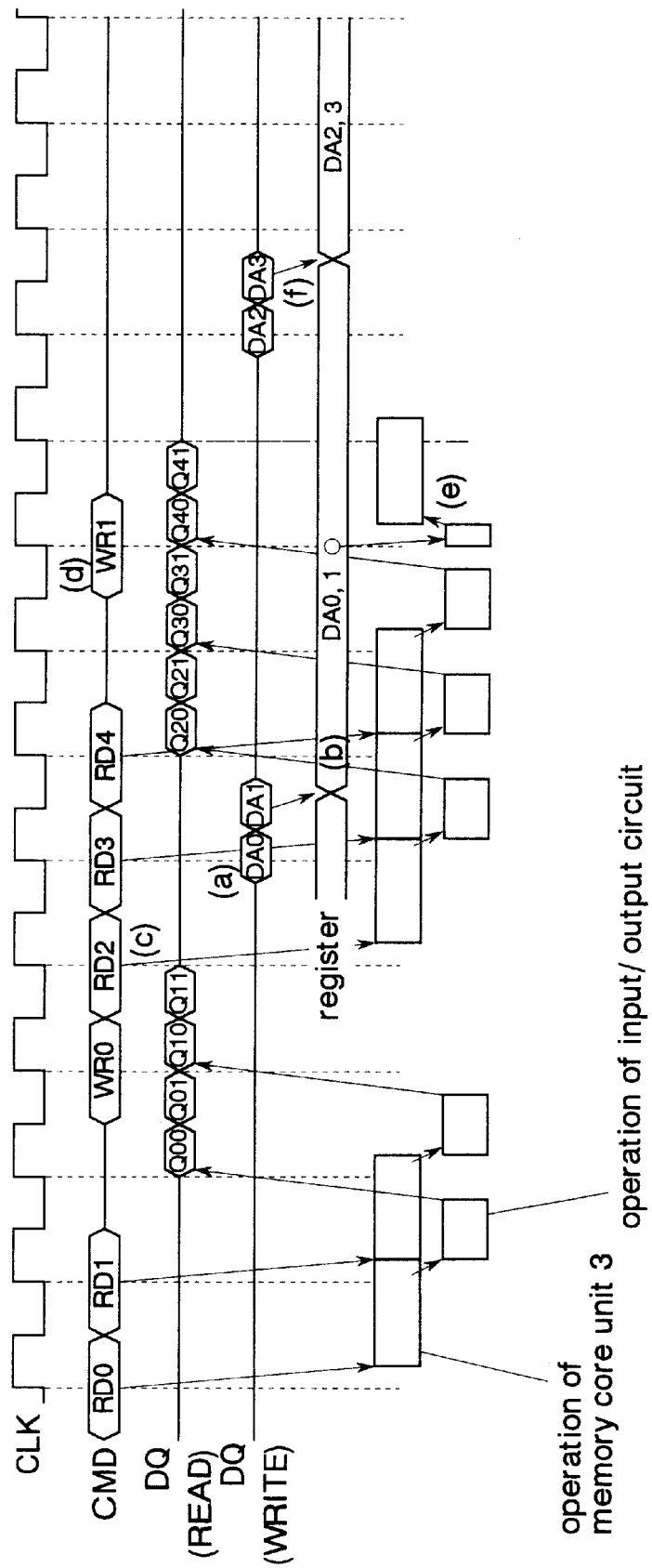
FIG. 5 is a timing chart showing the operation of an SDRAM having a conventional delayed write function.

Subsequently, in synchronization with the CLK signal that comes after the write command WR0, read commands RD2, RD3, and RD4 are sequentially supplied, whereby the same read operations as those of FIG. 5 are performed. Here, the read operations are immediately executed since the memory core units 3 have not executed a write operation.

Then, two clocks after the reception of the read command RD4, the next write command WR1 is supplied (FIG. 15(h)). Here, the control circuit 36 receives the high level of the FLG signal, and activates the CL signal to operate the memory core units 3. The control circuit 36 controls the switching circuit 40 so that the RAD signal corresponding to the previous write command WR0 is supplied to the memory core units 3 as the write address. In addition, the data masking circuit 46 masks the RWD signal with the RDM signal (FIG. 15(i)). The masked data are supplied to the memory core units 3 through the write amplifier 17. Thereby, the write operation on the data is executed corresponding to the previous write command WR0 (delayed write operation).

The write command WR1 activates the SET signal so that the data corresponding to this write command WR1 are held into the D flip-flops 42c in the control register 42. Those held signals are output as the RAD signal, the RWD signal, and the RDM signal (FIG. 15(j) and (k)).

In synchronization with the CLK signal that follows the write command WR1, read commands RD5 and RD6 are sequentially supplied (FIG. 15(l)).

The address comparator 44 compares the IAD signal (not shown) corresponding to the read command RD5 with the LAD signal corresponding to the write command WR1, in synchronization with the FLG signal (FIG. 15(m)). When the two signals coincide with each other, the coincidence signal S1 is turned to high level (FIG. 15(n)).

The data selector 48 receives the high level of the S1 signal and predetermined registered mask signals RDMa and RDMb. In accordance with the mask information, the data selector 48 outputs the LWD signal as the RDB signal. When only the RDMa signal indicates masking, the RDMa-corresponding first data signal DQ (Q50) is read out from the memory cells MC, and the RDMb-corresponding next data signal DQ (D1b) is read out from the control register 42 (FIG. 15(o)).

As described above, according to the semiconductor integrated circuit and the method of controlling a semiconductor integrated circuit in this embodiment, the data masking function can be provided to the SDRAM having the delayed write function, by holding the mask information into the control register 42 and controlling the address comparator 44 and the data selector 48.

Besides, the data masking circuit 23 masks the registered write data signal RWD with the registered mask signal RDM to generate a write data mask signal WDM. That is, write data are directly converted into mask data. Therefore, the masking function can be implemented with minimum modifications to the write circuit and the like.

Then, the write data are masked by the address comparator 44, the data masking circuit 46, and the data selector 48, ensuring proper data read even when a read operation is performed immediately after a write operation to the same address.

Figure 16:
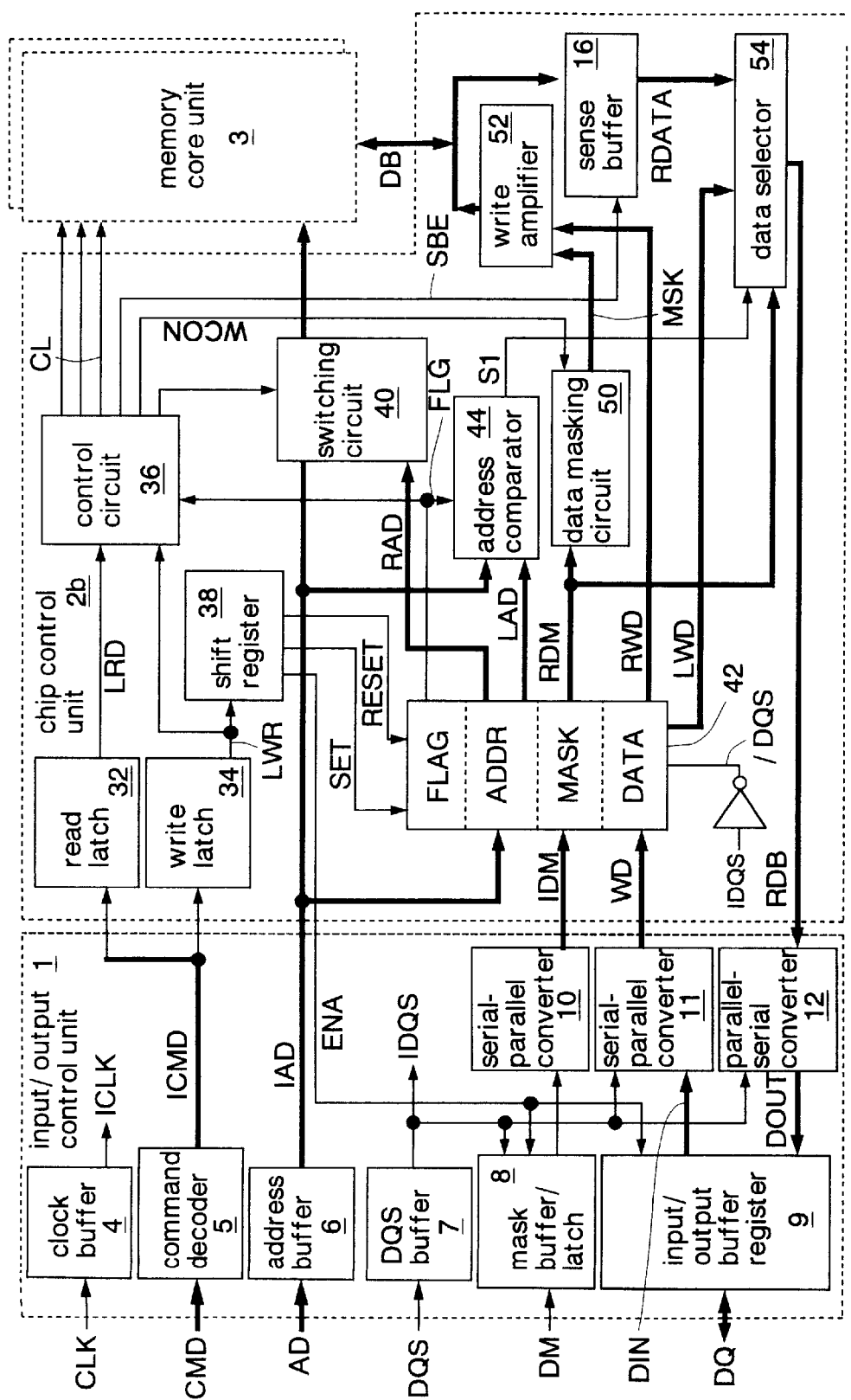
FIG. 16 is a block diagram showing a second embodiment of the semiconductor integrated circuit according to the present invention.

FIG. 16 shows a second embodiment of the semiconductor integrated circuit according to the present invention. The same circuits as those of the first embodiment will be designated by identical reference numbers, and detailed description thereof will be omitted.

In this embodiment, the chip control unit 2b differs from the chip control unit 2a of the first embodiment in the configuration of a data masking circuit 50, a write amplifier 52, and a data selector 54. The other configuration is identical to that of the first embodiment. Here, the write amplifier 52 corresponds to the write circuit 25 shown in FIG. 7.

The data masking circuit 50, consisting of e.g. AND circuits, outputs the registered mask signal RDM (RDMa, RDMb) as a mask signal MSK (MSKa, MSKb) when a write control signal WCON is activated.

The write amplifier 52 outputs the RWDa signal and the RWDb signal as a data signal DB when the MSKa signal and the MSKb signal are activated, respectively. Each of the MSK signals controls, for example, transmission gates formed in the write amplifier 52. The data signal DB is transmitted to bit lines BL through column switches (not shown) corresponding to the switching circuit 4 shown in FIG. 7.

That is, in the SDRAM of this embodiment, the data masking circuit 50 controls the write amplifier 52 to mask write data.

The data selector 54 receives an address coincidence signal S1 and the RDM signal. In accordance with the states of these signals, the data selector 54 selects a predetermined bit or bits of the read data signal RDATA and a predetermined bit or bits of the latched write data signal LWD, and outputs the resultant as the read data signal RDB.

Figure 17:
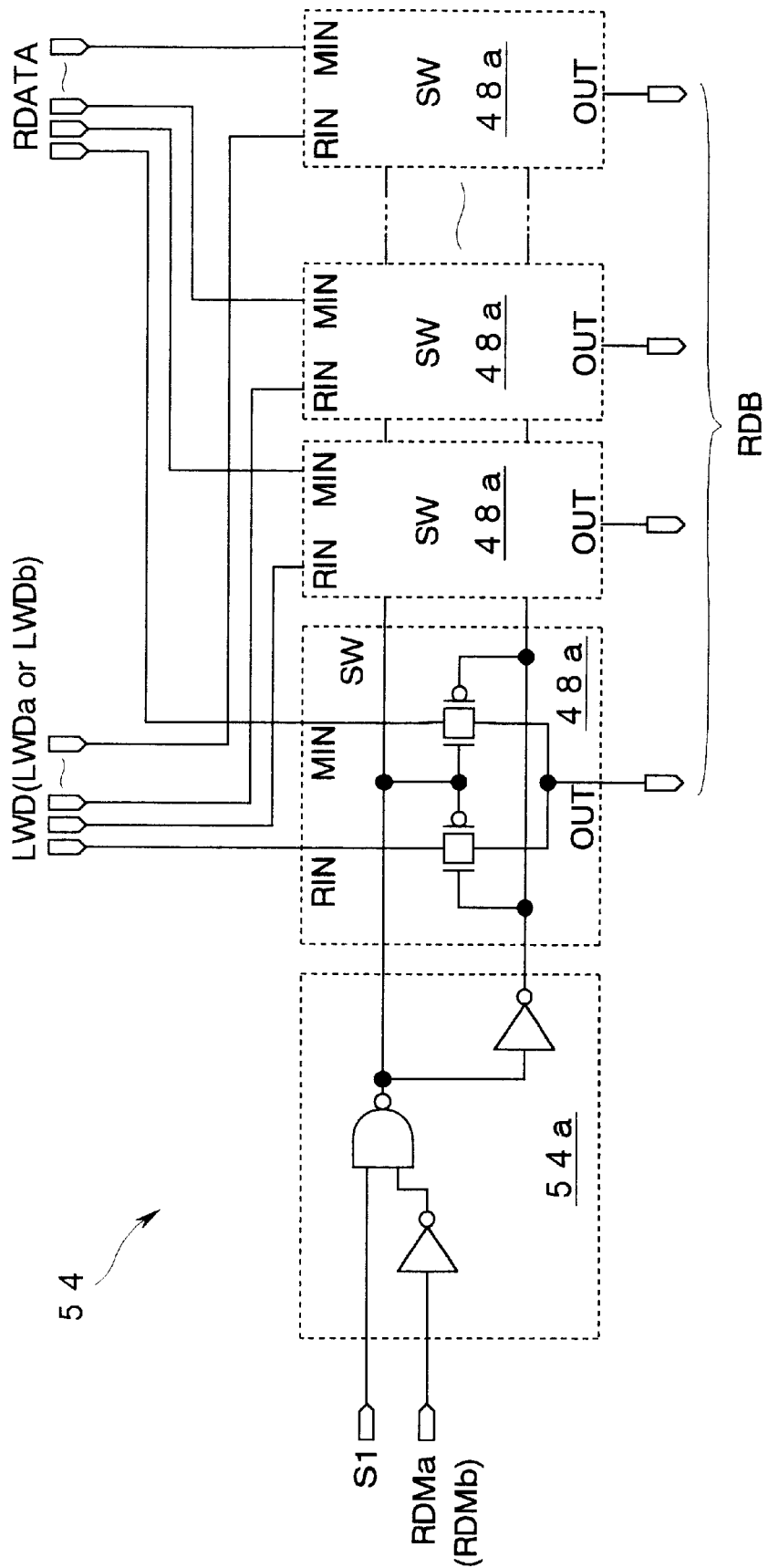
FIG. 17 is a circuit diagram showing the data selector in FIG. 16.

FIG. 17 shows the details of the data selector 54.

The data selector 54 has two units each consisting of a plurality of switching circuits 48a and a combinational circuit 54a. Here, the configuration excepting the combinational circuit 54a is identical to that of the data selector 48.

The combinational circuit 54a turns on those CMOS transmission gates on the MIN-terminal sides when the coincidence signal S1 is at low level (no address coincidence) or the RDMa signal (RDMb signal) is at high level (mask required). In contrast, the combinational circuit 54a turns on those CMOS transmission gates on the RIN-terminal sides when the S1 signal is at high level (address coincidence) and the RDMa signal (RDMb signal) is at low level (no masking required).

The SDRAM in this embodiment is under the same control flow by operating cycle and the same operating timing as those of FIGS. 14 and 15 described above.

This embodiment can also offer the same effects as those obtained from the first embodiment described above. Moreover, in this embodiment, write data can be masked by controlling the write amplifier 52.

Figure 18:
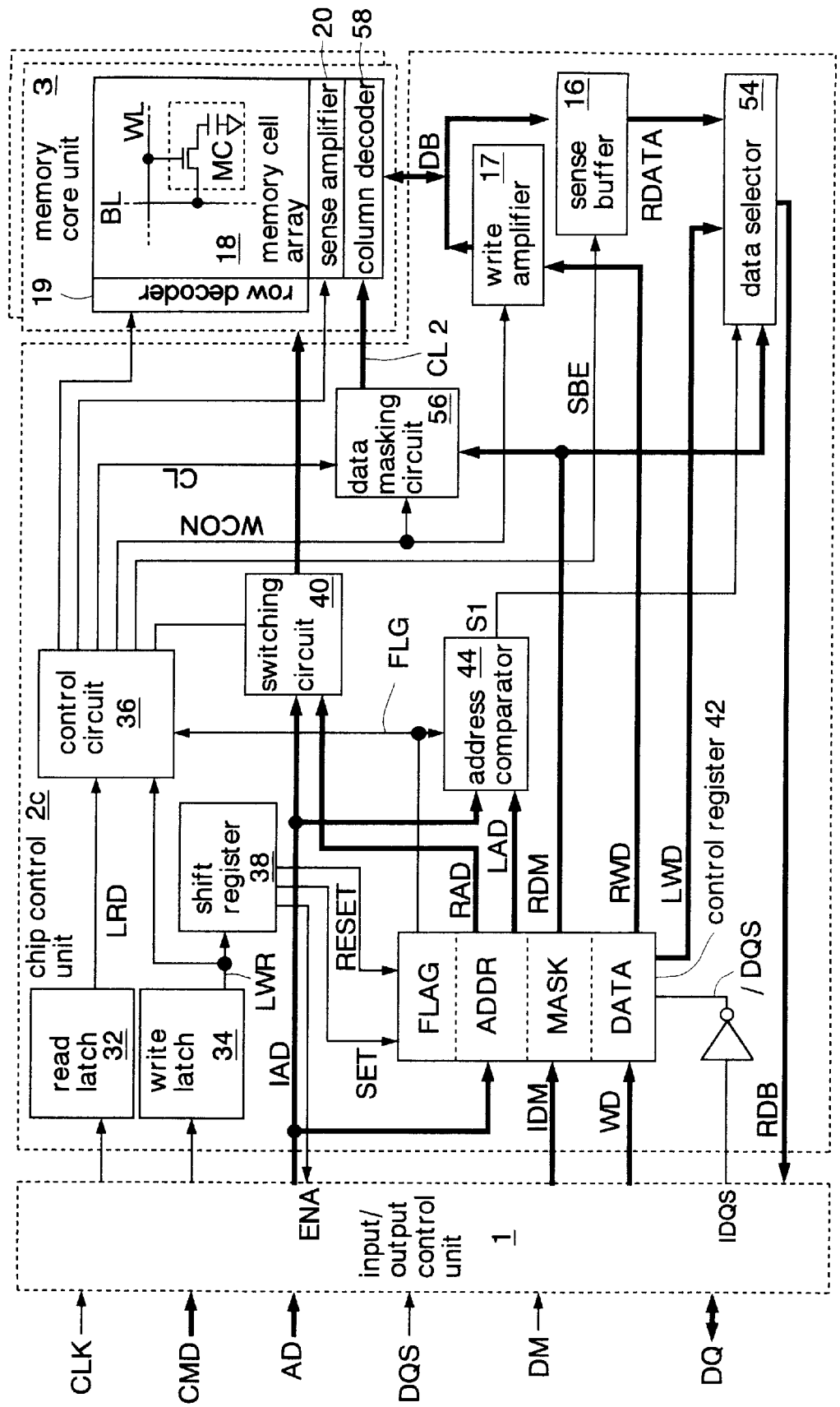
FIG. 18 is a block diagram showing a third embodiment of the semiconductor integrated circuit according to the present invention.

FIG. 18 shows a third embodiment of the semiconductor integrated circuit according to the present invention. The same circuits as those of the first embodiment will be designated by identical reference numbers, and detailed description thereof will be omitted.

This embodiment differs from the second embodiment in the configuration of a data masking circuit 56 and the write amplifier 17 in a chip control unit 2c, as well as of column decoders 58 in the memory core units 3. The other configuration is identical to that of the second embodiment.

The data masking circuit 56 receives the column control signal CL, the write control signal WCON, and the registered mask signal RDM (RDMa, RDMb), and outputs a column control signal CL2 (CL2a, CL2b). The data masking circuit 56 is a circuit for outputting the CL signal as the CL2 signal in a read operation (the WCON signal=low level), and outputting the CL signal as the CL2 signal when the RDM signal is at high level in a write operation (the WCON signal=high level).

The column decoders 58 activate decode signals according to the CL2 signal, so as to control the column switches (not shown).

The SDRAM in this embodiment is under the same control flow by operating cycle and the same operating timing as those of FIGS. 14 and 15 described above.

This embodiment can also offer the same effects as those obtained by the first embodiment described above. Moreover, in this embodiment, write data can be masked by controlling the column decoders 58.

Figure 19:
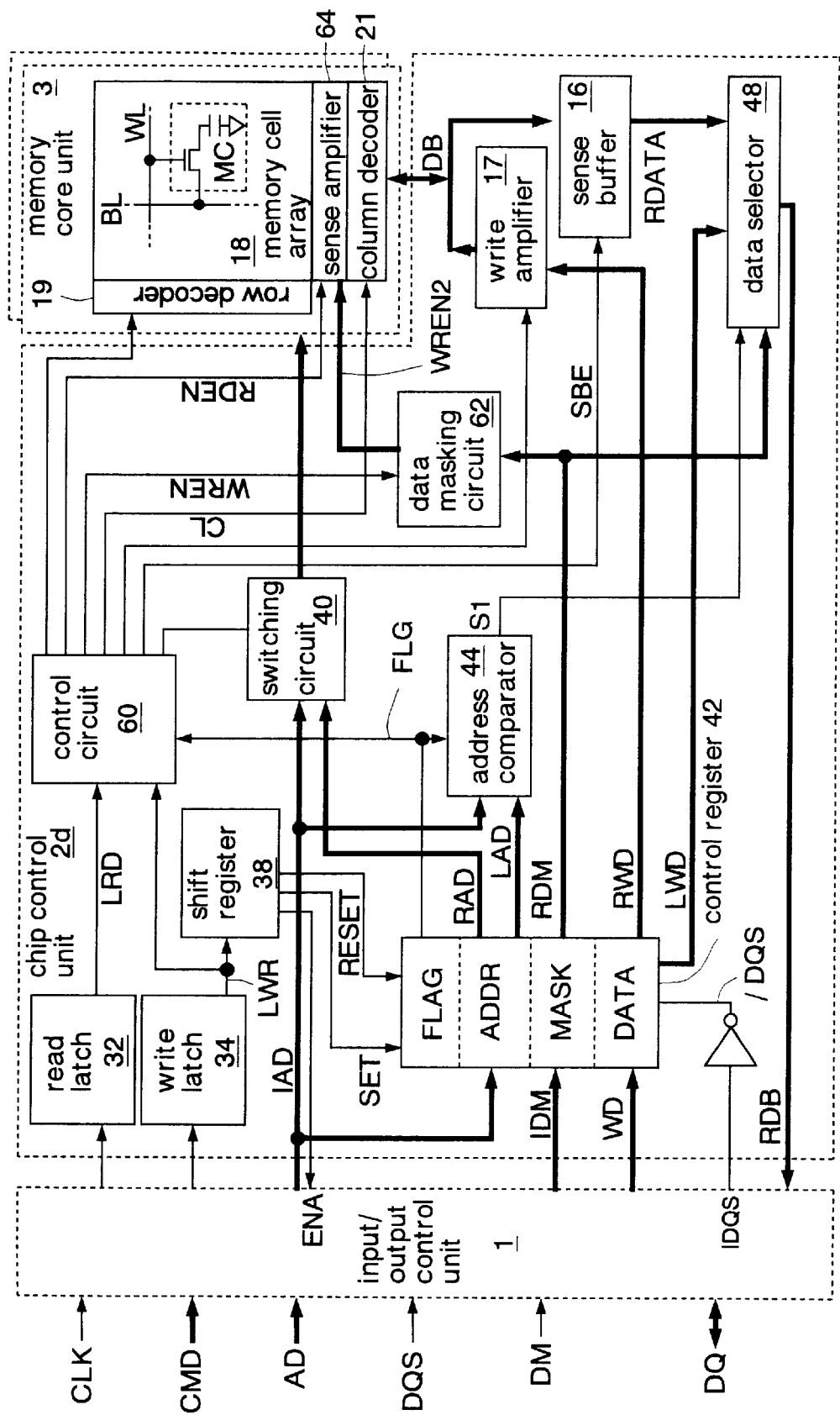
FIG. 19 is a block diagram showing a fourth embodiment of the semiconductor integrated circuit according to the present invention.

FIG. 19 shows a fourth embodiment of the semiconductor integrated circuit according to the present invention. The same circuits as those of the first embodiment will be designated by identical reference numbers, and detailed description thereof will be omitted.

This embodiment differs from the third embodiment in the configuration of a control circuit 60 and a data masking circuit 62 in a chip control unit 2d, as well as of sense amplifiers 64 and the column decoders 21 in the memory core units 3. The other configuration is identical to that of the third embodiment.

The control circuit 60 outputs a read enable signal RDEN for controlling the sense amplifiers 64 and a write enable signal WREN. The data masking circuit 62, when the registered mask signal RDM (RDMa, RDMb) is inactivated, outputs the write enable signal WREN as a write enable signal WREN2 (WREN2a, WREN2b).

Figure 20:
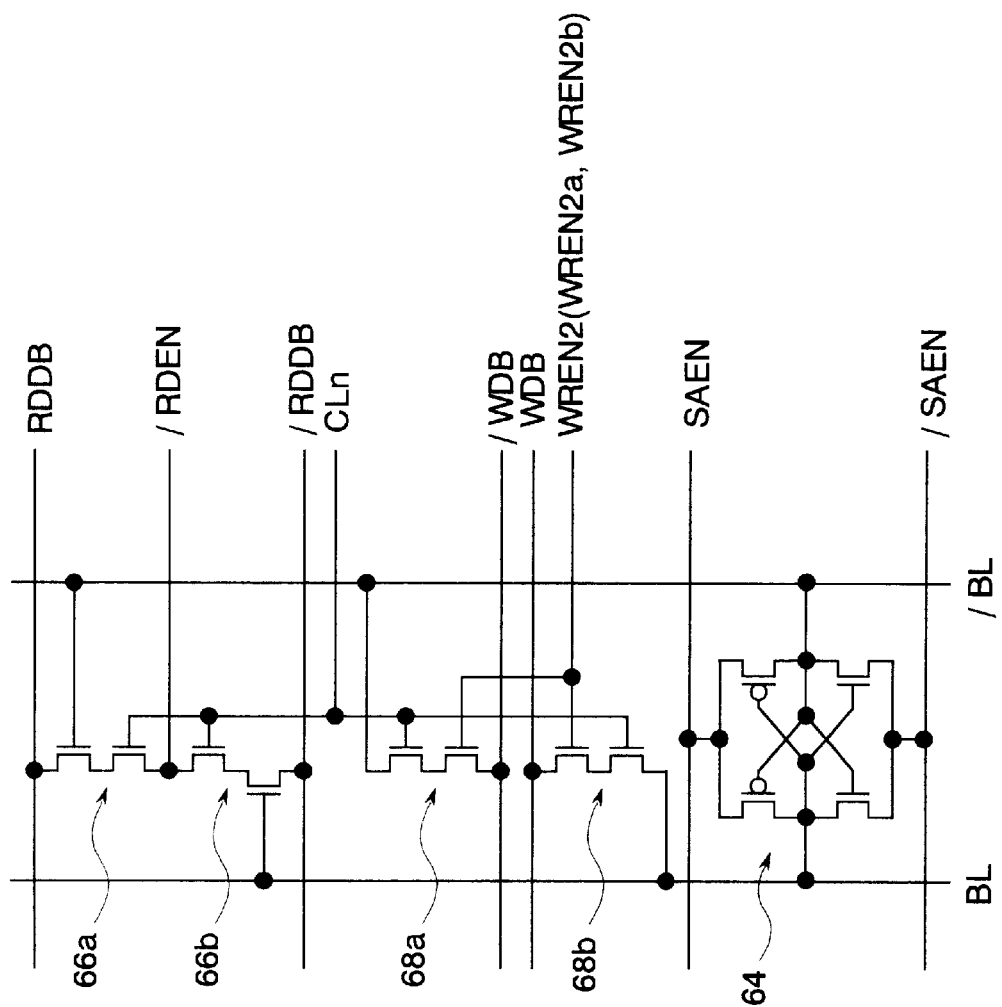
FIG. 20 is a circuit diagram showing the FIG. 19 sense amplifier and the vicinity thereof.

FIG. 20 shows a sense amplifier 64 and the ambient circuits.

The sense amplifier 64 consists of two CMOS inverters whose inputs and outputs are connected with each other. The outputs of the respective CMOS inverters are connected with the bit lines /BL and BL. In each CMOS inverter, the source of its pMOS is connected with a sense amplifier enable signal SAEN, and the source of its nMOS is connected with a sense amplifier enable signal /SAEN.

The bit lines BL, /BL are also connected with read switches 66a, 66b and write switches 68a, 68b, respectively. Each of these switches consists of two nMOSs connected in series. Here, the write switches 68a and 68b correspond to the switching circuit 24 shown in FIG. 7.

The read switches 66a and 66b are connected with the read enable signal /RDEN at their one ends, and output read data signals RDDB and /RDDB from the other ends, respectively. The nMOSs on the one-end sides of the read switches 66a and 66b receive a column selecting signal CLn at their gates. The gates of the nMOSs on the other sides are connected with the bit lines /BL and BL, respectively. That is, in this embodiment, the read switches 66a and 66b have an amplifying drivability. The read data from a memory cell MC are transmitted by controlling the gates of the nMOSs with the read signals transmitted to the bit lines BL and /BL. Such a circuit system is generally referred to as direct sensing. In the direct sensing, read operations are performed properly even in the cases where the column selecting signal CLn is activated before the data read from a memory cell MC is completely amplified. The direct sensing is thus suitable for high-speed operations.

The write switches 68a, 68b have one ends connected with the write data signals /WDB, WDB, and the other ends connected with the bit lines /BL, BL, respectively. The nMOSs on the one-end sides of the write switches 68a and 68b receive the WREN2 signal at their gates. The gates of the nMOSs on the other sides receive the CLn signal. A write operation is performed by the activated WREN2 signal turning on the write switches 68a and 68b. In this embodiment, the data masking circuit 62 controls the WREN2 signal in accordance with the RDM signal, to mask write data.

Alternatively, a column selecting signal dedicated to the write switches may be provided so that this column selecting signal is used for mask control instead of the WREN2 signal. In this case, the column selecting signal CLn shown in FIG. 20 should be separated into a column selecting signal CLn to be connected with the read switches 66a, 66b and a column selecting signal CLn to be connected with the write switches 68a, 68b.

The control flow and the operation timings in the operating cycle of the SDRAM in this embodiment are identical to those of FIGS. 14 and 15 described above.

This embodiment can also offer the same effects as those obtained from the first embodiment described above. Moreover, in this embodiment, write data can be masked by controlling the write switches 68a and 68b. In particular, the present invention is applicable without any modifications to those sense amplifier units of direct sensing system. In layout design, the circuit around the sense amplifiers requires highly advanced technology as the memory cells MC do. Such circuit can be diverted to shorten duration necessary for the development of the SDRAM.

Figure 21:
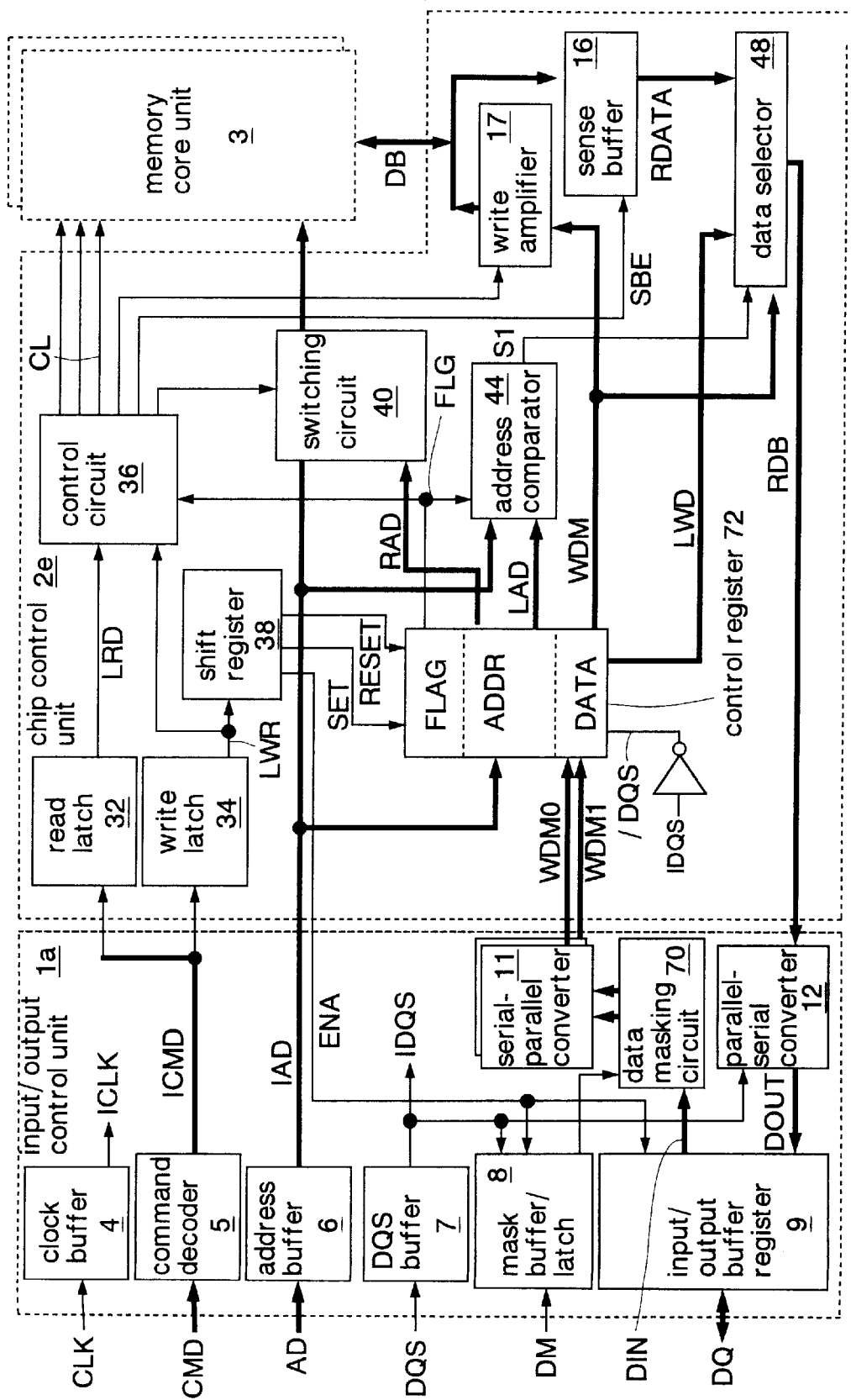
FIG. 21 is a block diagram showing a fifth embodiment of the semiconductor integrated circuit according to the present invention.

FIG. 21 shows a fifth embodiment of the semiconductor integrated circuit according to the present invention. The same circuits as those of the first embodiment will be designate by identical reference numbers, and detailed description thereof will be omitted.

In this embodiment, an input/output control unit 1a and a chip control unit 2e comprise a data masking circuit 70 and a control register 72 instead of the serial-parallel converter 10 and the control register 42 in the first embodiment, respectively.

The data masking circuit 70 sequentially receives mask data from the mask buffer/latch 8 and sequentially masks input data signals DIN with the received signals. The resulting complementary data mask signals are output to the serial-parallel converters 11. That is, in this embodiment, write data are masked in the input/output control unit 1a. The serial-parallel converters 11 convert the masked data into write data mask signals WDM0 and /WDM0 of parallel form.

The control register 72 in the chip control unit 2e is formed with a FLAG part, an ADDR part, and a DATA part but not a MASK part. The DATA part is different from the DATA part shown in FIG. 12 in having D flip-flops 42b and 42c for latching and holding the complementary WDM0 and /WDM0 signals. The DATA part outputs the latched and held data as the latched write data signal LWD and the write data mask signal WDM. The FLAG part and the ADDR part are the same circuits as those of FIG. 12.

This embodiment can also offer the same effects as those obtained from the first embodiment described above. Moreover, in this embodiment, the mask control is performed by the input/output control unit 1a. Therefore, the chip control unit 2e no longer needs to perform the mask control, so that the operation of the internal circuit is minimized. This consequently allows a reduction in power consumption.

Figure 22:
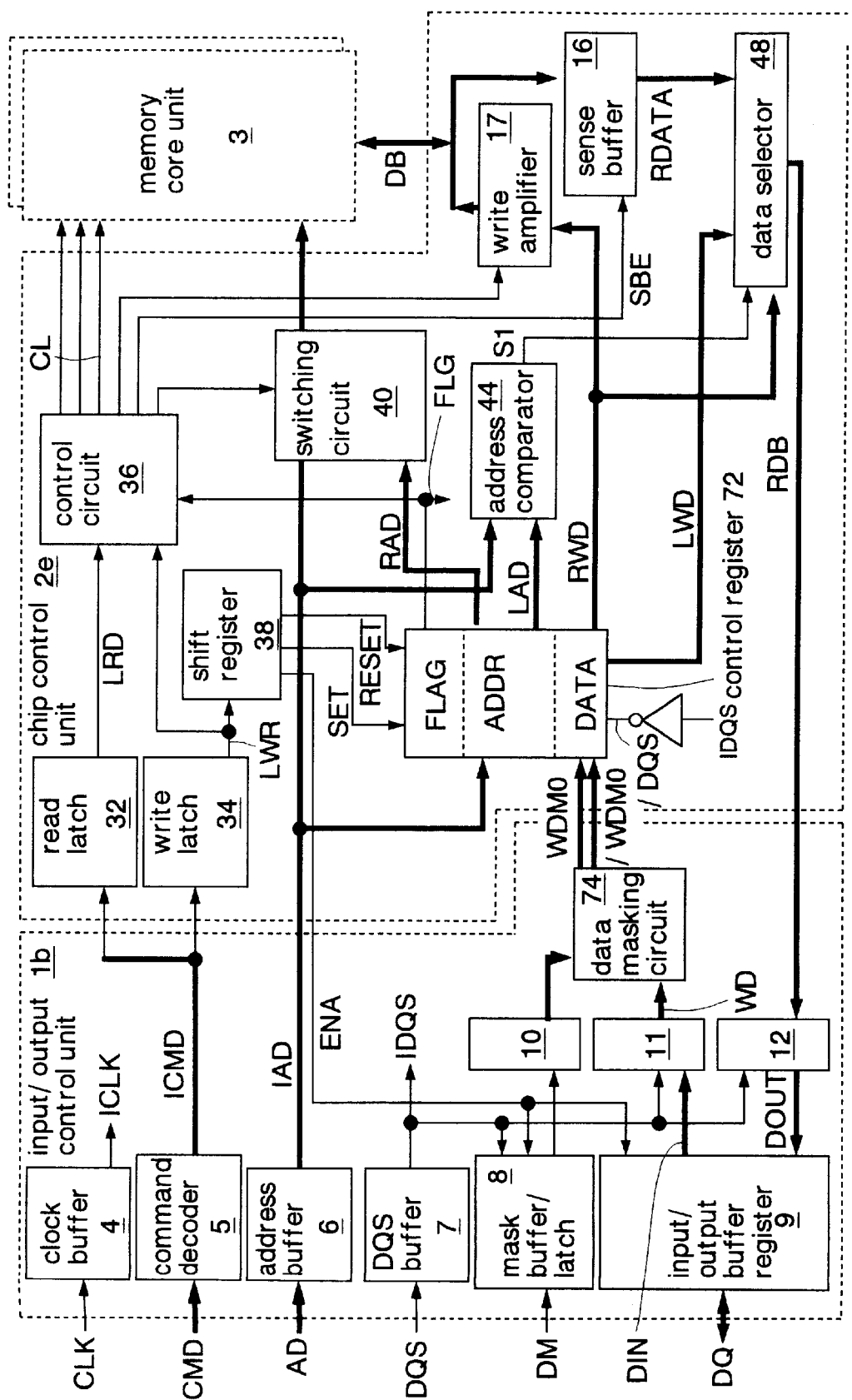
FIG.22 is a block diagram showing a sixth embodiment of the semiconductor integrated circuit according to the present invention.

FIG. 22 shows a sixth embodiment of the semiconductor integrated circuit according to the present invention. The same circuits as those of the fifth embodiment will be designated by identical reference numbers, and detailed description thereof will be omitted.

In this embodiment, an input/output control unit 1b is constituted by adding a data masking circuit 74 to the input/output control unit 1 of the first embodiment. The chip control unit 2e is identical to that of the fifth embodiment.

The data masking circuit 74 receives a parallel mask signal from the serial-parallel converter 10, masks the data signal WD, and outputs the resultant as the complementary WDM0 and /WDM0 signals.

This embodiment can also offer the same effects as those obtained from the fifth embodiment described above.

Figure 23:
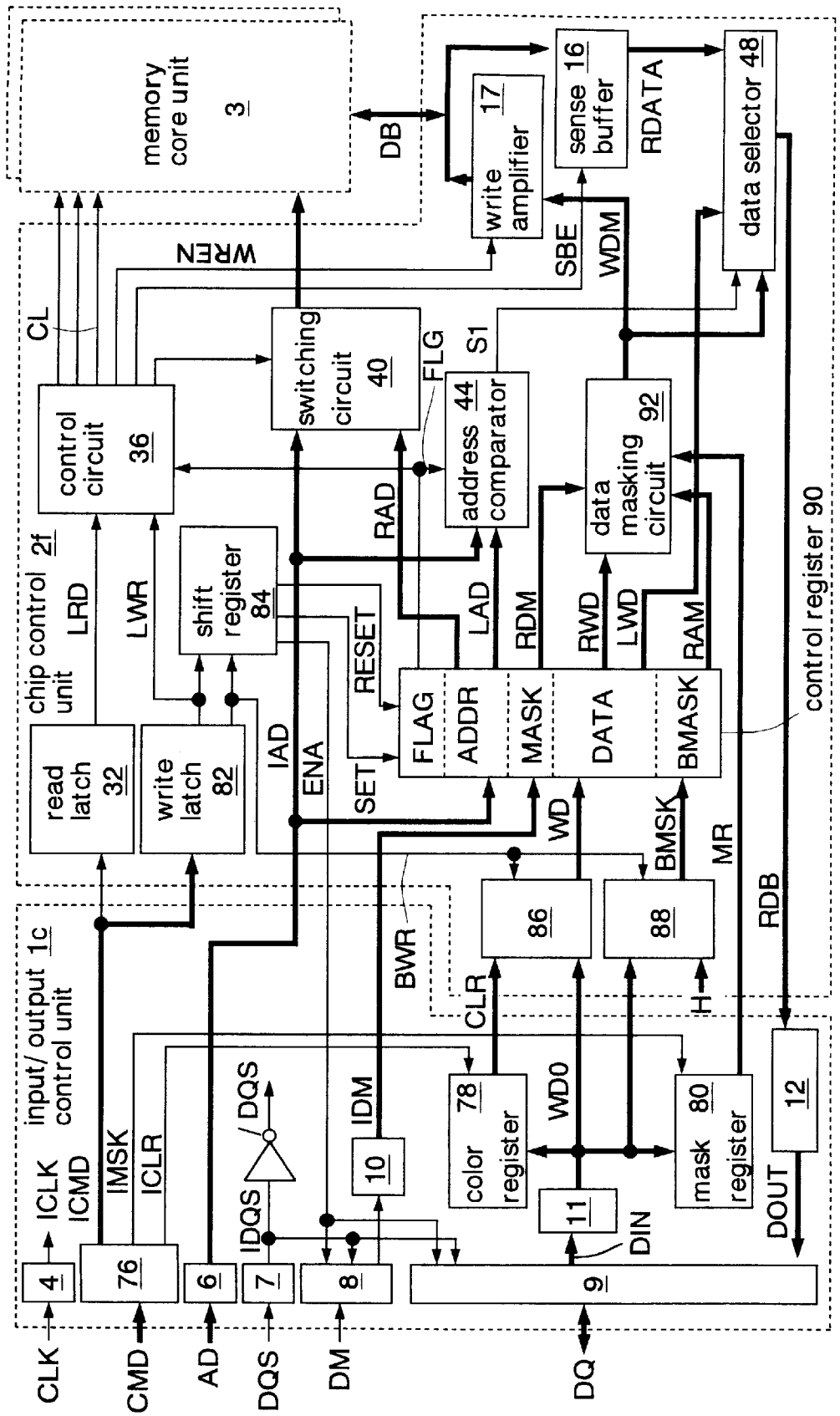
FIG. 23 is a block diagram showing a seventh embodiment of the semiconductor integrated circuit according to the present invention.

FIG. 23 shows a seventh embodiment of the semiconductor integrated circuit according to the present invention. The same circuits as those of the embodiments described above will be designated by identical reference numbers, and detailed description thereof will be omitted.

The semiconductor integrated circuit in this embodiment is formed as a graphics memory of DDR system in which data signals DQ are accepted in synchronization with both edges of the CLK signal.

The graphics memory comprises an input/output control unit 1c, a chip control unit 2f, and the memory core units 3.

The input/output control unit 1c comprises the clock buffer 4, a command decoder 76, the address buffer 6, the DQS buffer 7, the mask buffer/latch 8, the input/output buffer/register 9, the serial-parallel converters 10, 11, a color register 78, a mask register 80, and the parallel-serial converter 12.

The command decoder 76 receives the command signal CMD, analyzes the received command, and outputs the resultant as the internal command signal ICMD, an internal mask signal IMSK, and an internal color register signal ICLR. Here, the ICMD signal includes a read command, a normal write command, a block write command, and the like. A block write mode is an operating mode specific to graphics memory for continuously writing a plurality of bytes of data. The IMSK signal is activated upon the reception of a mask register setting command. The ICLR signal is activated upon the reception of a color register setting command.

The color register 78 accepts a write data signal WD0 from the serial-parallel converter 11 in synchronization with the ICLR signal, and outputs the same as a color signal CLR. The color data (the CLR signal) held in the color register 78 are used as the write data in a block write mode.

The mask register 80 accepts the WD0 signal from the serial-parallel converter 11 in synchronization with the IMSK signal, and outputs the same as a mask register signal MR. The data (MR signal) held in the mask register 80 are used in masking a predetermined bit or bits of the color data to be written in a block write mode. That is, in this graphics memory, the data signal DQ can be masked by the mask register 80 on a bit-by-bit basis.

The chip control unit 2f comprises the read latch 32, a write latch 82, the control circuit 36, a shift register 84, switching circuits 40, 86, and 88, a control register 90, the address comparator 44, a data masking circuit 92, the write amplifier 17, the sense amplifier 16, and the data selector 48.

The write latch 82 latches predetermined ICMD signals, and outputs the latched signals as the latched write signal LWR and a burst write signal BWR.

The shift register 84 receives the LWR signal, the BWR signal, and a not-shown ICMD signal, and outputs the set signal SET, the reset signal RESET, and the enable signal ENA at predetermined timings.

The switching circuits 86 selects either the CLR signal from the color register 78 or the data signal from the serial-parallel converter 11 in accordance with the BWR signal, and outputs the resultant as the write data WD.

The switching circuit 88 selects either the WD0 signal or a high-level input signal in accordance with the BWR signal, and outputs the resultant as a burst mask signal BMSK.

The control register 90 comprises a flag part FLAG, an address holding part ADDR, a mask holding part MASK, a data holding part DATA, and a burst address masking part BMASK. The flag part FLAG, the address holding part ADDR, the mask holding part MASK, and the data holding part DATA are the same circuits as those of the first embodiment.

The burst address masking part BMASK accepts the BMSK signals in synchronization with the not-shown /DQS signal, and outputs the accepted signal as a registered burst address mask signal RAM.

The data masking circuit 92 masks a predetermined bit or bits of the registered write data signal RWD in accordance with the registered mask signal RDM and the MR signal, and outputs the masked data as the data mask signal WDM.

Figure 24:
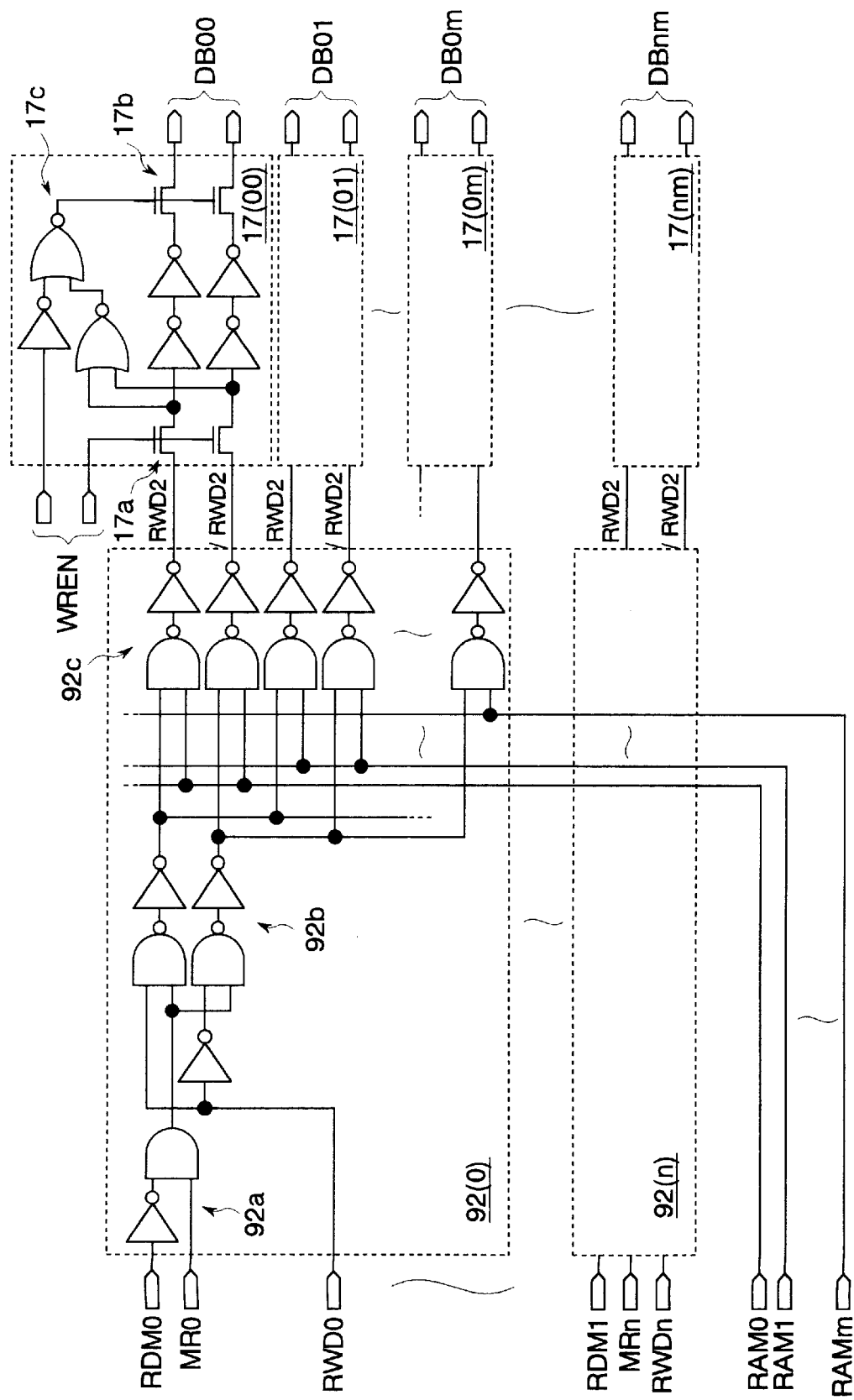
FIG. 24 is a circuit diagram showing the data masking circuit and the write amplifier in FIG. 23.

FIG. 24 shows the details of the data masking circuit 92 and the write amplifier 17.

The data masking circuit 92 consists of n combinational circuits 92(1)–92(n). In this embodiment, "n" as well as "m" to be described later is set at the number corresponding to twice the number of bits of the DQ signal, which is 15. Each of the combinational circuits 92(0)–92(n) includes an AND circuit 92a, two AND circuits 92b, and a plurality of AND circuits 92c.

The AND circuit 92a activates upon receiving the low level of the RDM signal (RDM0, RDM1) from the mask holding part MASK and the high level of the MR signal (MR0–MRn) from the mask register 80, and output high level. The AND circuits 92b activates upon receiving the high level from the AND circuit 92a, and output complementary signals of the RWD signal. The AND circuits 92c activates in accordance with the RAM signal (RAM0–RAMm) from the burst address masking part BMASK, and output complementary RWD2 and /RWD2 signals to the write amplifier 17.

The write amplifier 17 consists of n×m write circuits 17(00)–17(nm). Each of the write circuits 17(00)–17(nm) includes nMOS transmission gates 17a and 17b respectively connected with the inputs and outputs of input buffers consisting of two inverters. The gate electrodes of the nMOS transmission gates 17a are supplied with an accepting pulsed signal generated from the WREN signal. The gate electrodes of the nMOS transmission gates 17b are put under the control of a combinational circuit 17c. The combinational circuit 17c inhibits a write pulsed signal generated from the WREN signal from being transmitted to the nMOS transmission gates 17b when both the complementary RWD2 and /RWD2 signals transmitted through the nMOS transmission gates 17a are at low level.

Now, description will be given of the operation of the above-described graphics memory.

Initially, in a normal write operation, the switching circuit 86 shown in FIG. 23 receives the low level of the BWR signal to select the WD0 signal from the serial-parallel converter 11, and outputs the signal as the WD signal. Meanwhile, the switching circuit 88 selects the high-level signal and outputs it as the BMSK signal. The burst address masking part BMASK inactivates the RAM signal when the BMSK signal is flat at high level. That is, in a normal operation, the burst address masking function is invalidated. With predetermined data masked with the RDM signal, a delayed write operation is then executed under the same timing as that of the first embodiment.

Figure 25:
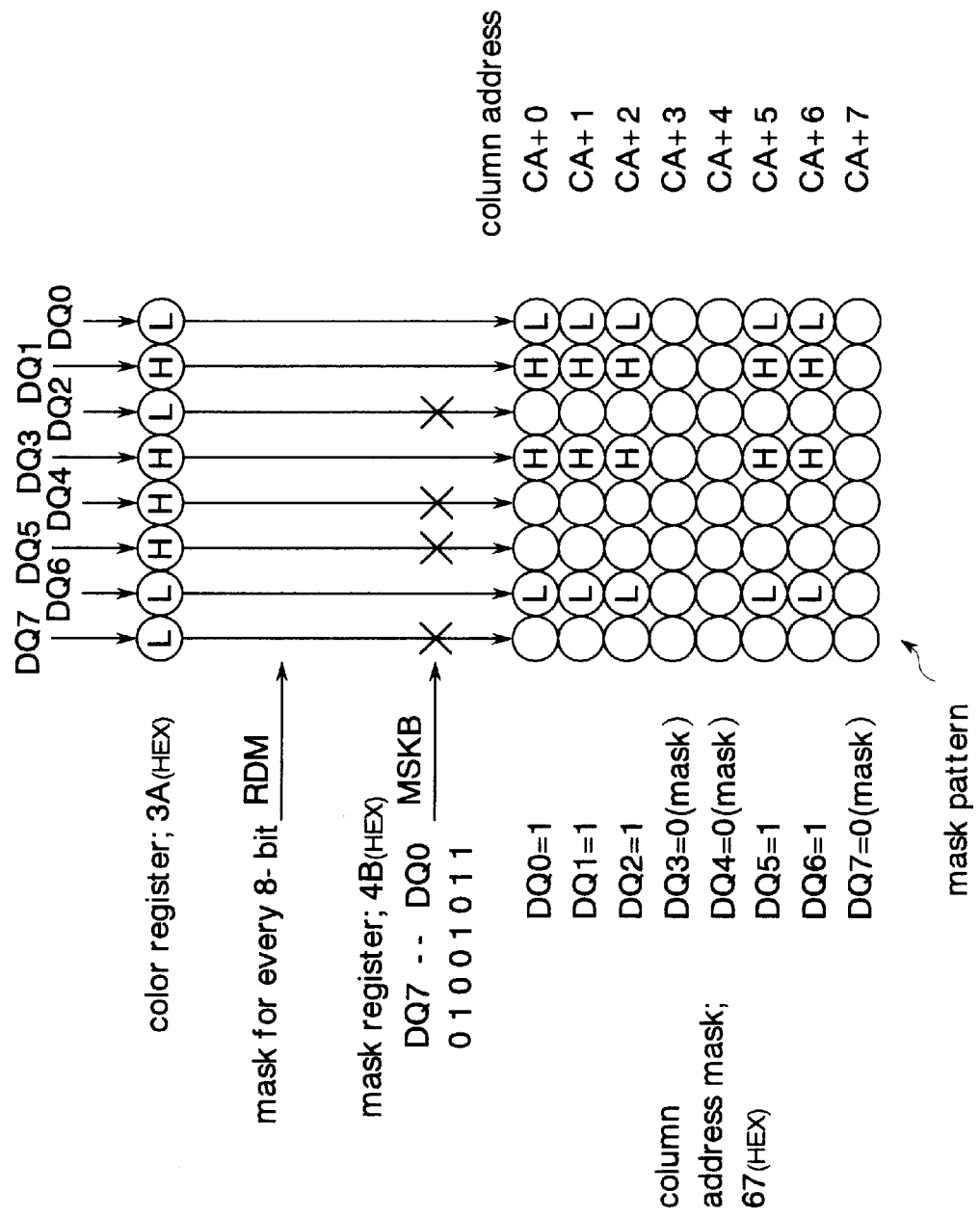
FIG. 25 is an explanatory diagram showing an overview of the write data operation in block write mode in the seventh embodiment.

FIG. 25 shows an overview of the write data operation in the block write mode. Incidentally, shown in FIG. 25 is an example where the write data and a burst column address consist of eight bits each. In fact, the graphics memory of this embodiment can accept data signals DQ in synchronization with the rising and falling edges of the CLK signal; therefore, the write data and the burst column address are of 16 bits.

In the block write mode, the color register setting command and the mask register setting command are supplied in advance so that predetermined values are written to the color register 78 and the mask register 80 shown in FIG. 23. In this example, the color register 78 and the mask register 80 contain "3A" and "4B" in hexadecimal, respectively.

In addition, the write latch 82 receives a block write command to turn the BWR signal to high level. The switching circuit 86 receives the BWR signal to select the CLR signal and output it as the WD signal. The switching circuit 88 receives the BWR signal so that the WD0 signal (DQ signal) corresponding to the block write command is selected and output as the BMSK signal. In this example, the BMSK signal (DQ signal) to mask the column addresses is "67" in hexadecimal.

The control register 90 receives the SET signal by the block write command and holds each data. The held data are written to memory cells MC upon receiving the next block write command or the next write command.

Specifically, the data masking circuit 92 shown in FIG. 24 receives the next block write command or the next write command, and outputs the RWD signal (the color data in the color register 78) to those write circuits 17(00)–17(nm) according to the RAM signal (the mask data for the column addresses). The following shows in what cases the complementary RWD2 and /RWD2 signals output from which combinational circuits 92(0)–92(n) are turned to low level.

(1) when the RDM0 signal or the RDM1 signal (the 8-bit mask signal) is at high level, all the RWD2 and /RWD2 signals output from the eight combinational circuits 92(0)–92(n);

(2) when any of the MR0–MRn signals (the mask data in the mask register 80) are at low level, those RWD2 and /RWD2 signals output from the corresponding combinational circuits 92(0)–92(n); and (3) when any bits of the RAM signal are at low level, those RWD2 and /RWD2 signals output from the corresponding combinational circuits 92(0)–92(n).

Accordingly, as shown in FIG. 25, the write data are initially masked in steps of eight bits. The data are then masked in accordance with the data in the mask register 80, and further masked by each column address. When the RDM0 and RDM1 signals are at low level, there is no 8-bit mask. Then, the data set in the color register 78 are sequentially transmitted to the write amplifier 17 as the shown masked patterns, and written to the memory core units 3. In other words, a block write is performed.

As described above, even a graphics memory with the block write mode can perform delayed write operations with maintaining the conventional masking function.

Besides, since the present invention is applied to a graphics memory of DDR system in which the data signals DQ are accepted in synchronization with both edges of the CLK signal, the write operations can be performed at higher speeds.

Figure 26:
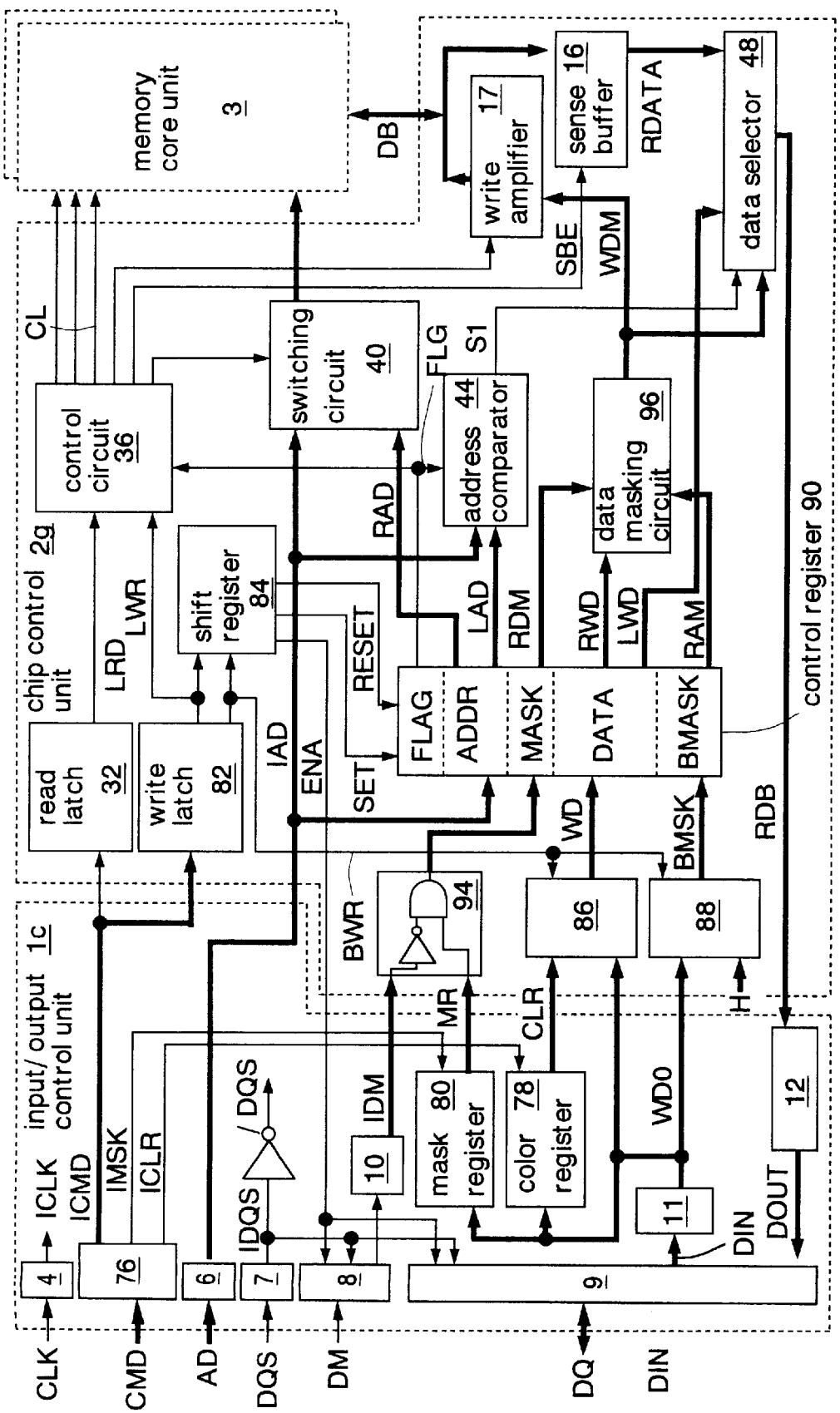
FIG. 26 is a block diagram showing an eighth embodiment of the semiconductor integrated circuit according to the present invention.

FIG. 26 shows an eighth embodiment of the semiconductor integrated circuit according to the present invention. The same circuits as those of the seventh embodiment described above will be designated by identical reference numbers, and detailed description thereof will be omitted.

The semiconductor integrated circuit in this embodiment is formed as a graphics memory of DDR system in which data signals DQ are accepted in synchronization with both edges of the CLK signal.

In this embodiment, a chip control unit 2g is constituted by adding a mask control circuit 94 to the chip control unit 2f of the seventh embodiment. Besides, a data masking circuit 96 is different from the data masking circuit 92 of the seventh embodiment. The other circuits are identical to those of the seventh embodiment.

The mask control circuit 94 is the same circuit as the AND circuit 92a shown in FIG. 24. The mask control circuit 94 is activated upon receiving the low level of the internal mask signal IDM from the serial-parallel converter 10 and the high level of the MR signal from the mask register 80, and outputs high level. The output signal of the mask control circuit 94 is held into the mask holding part MASK of the control register 90.

The data masking circuit 96 masks a predetermined bit or bits of the registered write data signal RWD in accordance with the registered mask signal RDM, and outputs the masked data as the write data mask signal WDM.

Figure 27:
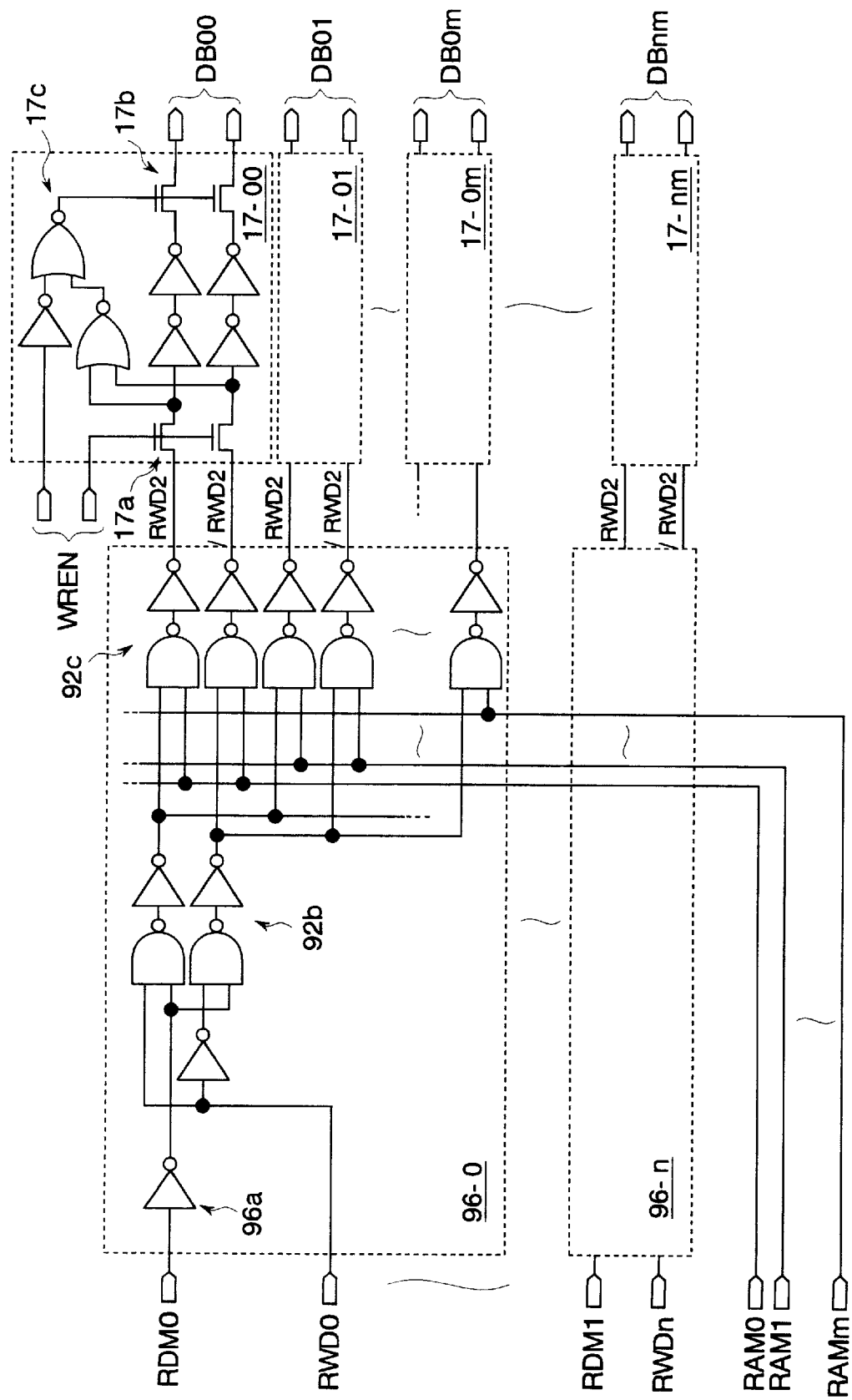
FIG. 27 is a circuit diagram showing the data masking circuit and the write amplifier in FIG. 26.

FIG. 27 shows the details of the data masking circuit 96 and the write amplifier 17.

The data masking circuit 96 is a circuit constituted by replacing the AND circuits 92a of the data masking circuit 92 shown in FIG. 24 with inverters 96a for receiving the RDM signal. The write amplifier 17 is the same circuit as that of FIG. 24.

In the graphics memory of this embodiment, the mask control circuit 94 synthesizes the IDM signal and the MR signal, and holds the mask information synthesized into the mask holding part MASK. Therefore, the data masking circuit 96 can be reduced in logical scale, allowing faster write operations as compared to the seventh embodiment.

In the embodiments described above, the present invention is applied to an SDRAM or a graphics memory, however, the present invention is not limited to such embodiments. For example, the present invention may be applied to other DRAMs such as an FCRAM which operates in synchronization with a clock signal or a system LSI having DRAM memory cores implemented therein.

Moreover, in the first embodiment described above, the present invention is applied to a DDR SDRAM, however, the present invention may also be applied to an SDR SDRAM (Single Data Rate SDRAM) in which data are input/output in synchronization with the rising edges of a clock signal.

Furthermore, in the first embodiment described above, both the read latency and the write latency are set at "2". The latencies may have a value other than "2". The read latency and the write latency may differ in value.

A semiconductor fabrication process to which the present invention is applied is not limited to the CMOS process, but it may well be a Bi-CMOS process.

The invention is not limited to the above embodiments and various modifications may be made without departing from the spirit and the scope of the invention. Any improvement may be made in part or all of the components.

What is claimed is:

1. A semiconductor integrated circuit comprising:

memory cells; and a holding unit for holding write data to said memory cells and mask information for masking a predetermined bit of the write data, both supplied corresponding to a write command, as held write data and held mask information, wherein upon reception of a next write command, said held write data corresponding to said write command are masked in accordance with said held mask information and written to said memory cells and next write data and next mask information supplied corresponding to said next write command are held in said holding unit.

2. A semiconductor integrated circuit according to claim 1, comprising a data masking circuit for receiving said held write data and said held mask information output from said holding unit and masking a predetermined bit of said held write data in accordance with said held mask information.

3. A semiconductor integrated circuit according to claim 1, comprising:

a bit line connected with said memory cells;

a switch connected with said bit line, transmitting said held write data to said bit line;

a write circuit for supplying said held write data to said switch; and a data masking circuit for controlling said write circuit in accordance with said held mask information and masking a predetermined bit of said held write data.

4. A semiconductor integrated circuit according to claim 1, comprising:

a decoder for selecting said memory cells to be written said held write data; and a data masking circuit for controlling said decoder in accordance with said held mask information and masking a redetermined bit of said held write data.

5. A semiconductor integrated circuit according to claim 1, comprising:

a bit line connected with said memory cells;

a switch connected with said bit line, transmitting said held write data to said bit line; and a data masking circuit for controlling said switch in accordance with said held mask information and masking a predetermined bit of said held write data.

6. A semiconductor integrated circuit according to claim 1, comprising:

an address holding part for holding a write address supplied corresponding to said write command as a held write address;

an address comparing part for comparing said held write address with a read address supplied corresponding to a read command; and a data selecting part for selecting a predetermined bit of read data from said memory cells and a predetermined bit of said held write data in accordance with said held mask information when the comparison result from said address comparing part indicates the coincidence of said held write address and said read address.

7. A semiconductor integrated circuit comprising:

memory cells;

a data masking circuit for receiving write data and mask information supplied corresponding to a write command and masking a predetermined bit of the write data in accordance with the mask information; and a holding unit for holding data masked by said data masking circuit as held mask data, wherein upon the reception of a next write command, said held mask data are written to said memory cells and mask data generated from next write data supplied corresponding to said next write command are held as said held mask data.

8. A semiconductor integrated circuit according to claim 7, comprising:

an address holding part for holding a write address supplied corresponding to said write command as a held write address;

an address comparing part for comparing said held write address with a read address supplied corresponding to a read command; and a data selecting part for selecting a predetermined bit of read data from said memory cells and a predetermined bit of said held write data in accordance with said held mask information when the comparison result from said address comparing part indicates the coincidence of said held write address and said read address.

9. A method of controlling a semiconductor integrated circuit, comprising the steps of:

holding write data to memory cells and mask information for masking a predetermined bit of the write data, both supplied corresponding to a write command, as held write data and held mask data;

upon reception of a next write command, masking said held write data corresponding to said write command in accordance with said held mask information and writing the masked data to said memory cells; and holding next write data and next mask information supplied corresponding to said next write command as held write data and held mask information.

* * * * *